(12) United States Patent
Schnell et al.

(10) Patent No.: US 12,189,978 B2
(45) Date of Patent: Jan. 7, 2025

(54) COMPRESSION ATTACHED MEMORY MODULE (CAMM) FOR LOW-POWER DOUBLE DATA RATE (LPDDR) MEMORIES

(71) Applicant: Dell Products, L.P., Round Rock, TX (US)

(72) Inventors: Arnold Thomas Schnell, Hutto, TX (US); Joseph Daniel Mallory, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/656,662

(22) Filed: Mar. 28, 2022

(65) Prior Publication Data

US 2023/0305736 A1 Sep. 28, 2023

(51) Int. Cl.
*G06F 3/06* (2006.01)

(52) U.S. Cl.
CPC ............ *G06F 3/0655* (2013.01); *G06F 3/061* (2013.01); *G06F 3/0673* (2013.01)

(58) Field of Classification Search
CPC ....... G06F 3/0655; G06F 3/061; G06F 3/0673
See application file for complete search history.

(56) References Cited

U.S. PATENT DOCUMENTS

| | | | |
|---|---|---|---|
| 11,074,952 B1* | 7/2021 | Schnell | G11C 11/161 |
| 11,321,009 B2* | 5/2022 | Schnell | G11C 11/161 |
| 2014/0185226 A1* | 7/2014 | Lam | H05K 1/141 |
| | | | 361/679.31 |
| 2017/0168528 A1* | 6/2017 | Ouyang | G06F 1/1681 |
| 2017/0220301 A1* | 8/2017 | Nobunaga | G11C 7/22 |
| 2017/0243626 A1* | 8/2017 | Bacchus | G11C 5/147 |
| 2021/0315124 A1* | 10/2021 | Norton | H01R 12/737 |
| 2021/0321516 A1* | 10/2021 | Rao | H05K 1/111 |
| 2021/0344130 A1* | 11/2021 | Li | H01R 12/7076 |
| 2022/0272880 A1* | 8/2022 | Chauhan | H01L 23/32 |
| 2022/0350754 A1* | 11/2022 | Schnell | G06F 13/4068 |

* cited by examiner

*Primary Examiner* — Zhuo H Li
(74) *Attorney, Agent, or Firm* — Larson Newman, LLP

(57) ABSTRACT

Embodiments of systems and methods for a Compression Attached Memory Module (CAMM) for Low-Power Double Data Rate (LPDDR) memories are described. In an illustrative, non-limiting embodiment, an Information Handling System (IHS) may include: a compression Dual In-Line Memory Module (cDIMM) connector coupled to a motherboard; and a memory module coupled to the cDIMM connector, where the memory module comprises an LPDDR device coupled to a top surface of the memory module and accessible via surface contact connections disposed on a bottom surface of the memory module.

18 Claims, 22 Drawing Sheets

COMPRESSION ATTACHED MEMORY MODULE (CAMM) FOR LOW-POWER DOUBLE DATA RATE (LPDDR) MEMORIES

FIELD

This disclosure relates generally to Information Handling Systems (IHSs), and more specifically, to systems and methods for a Compression Attached Memory Module (CAMM) for Low-Power Double Data Rate (LPDDR) memories.

BACKGROUND

As the value and use of information continues to increase, individuals and businesses seek additional ways to process and store it. One option available to users is an Information Handling System (IHS). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

SUMMARY

Embodiments of systems and methods for a Compression Attached Memory Module (CAMM) for Low-Power Double Data Rate (LPDDR) memories are described. In an illustrative, non-limiting embodiment, an Information Handling System (IHS) may include: a compression Dual In-Line Memory Module (cDIMM) connector coupled to a motherboard; and a memory module coupled to the cDIMM connector, where the memory module comprises an LPDDR device coupled to a top surface of the memory module and accessible via surface contact connections disposed on a bottom surface of the memory module.

The memory module may have a same vertical footprint as the cDIMM connector or a smaller vertical footprint than the cDIMM connector. The memory module and the cDIMM connector may include a plurality of holes configured to receive fasteners that apply a compressive force between the memory module and the cDIMM connector. Also, the memory module and the cDIMM connector may include a plurality of alignment features configured to facilitate mounting of the memory module to the cDIMM connector.

The IHS may also include a processor coupled to the motherboard, where the processor is configured to access the LPDDR device via the surface contact connection. Each surface contact connection may be configured to be engaged with a corresponding surface contact element of the cDIMM connector. The plurality of surface contact connections may include a left set of connections, a middle set of connections, and a right set of connections, where the right set of connections has columns disposed at an acute angle with respect to columns of the middle set of connections, and where the left set of connections has columns disposed at a negative acute angle with respect to the columns of the middle set of connections. A first set of surface contact connections may be associated with a first memory channel and arranged as a mirror image of a second set of surface contact connections associated with a second memory channel with respect to a middle row or column of the surface contact connections.

The memory module may include a plurality of LPDDR devices, and the LPDDR devices may be configured to be accessed via four memory channels. A first set of surface contact connections associated with a first memory channel and a second set of surface contact connections associated with a second memory channel may be arranged as a mirror image of a third set of surface contact connections associated with a third memory channel and a fourth set of surface contact connections associated with a fourth memory channel with respect to a middle row or column of the surface contact connections.

In another illustrative, non-limiting embodiment, a memory module may include a plurality of LPDDR devices coupled to a top surface of the memory module and a plurality of surface contact connections disposed on a bottom surface of the memory module, where each surface contact connection is configured to be engaged with a corresponding surface contact element of a cDIMM connector after assembly.

In yet another illustrative, non-limiting embodiment, a method may include receiving a memory module having LPDDR devices coupled to a top surface of the memory module and configured to be accessed via surface contact connections disposed on a bottom surface of the memory module, and coupling the memory module to a cDIMM connector of a PCB of an IHS, where each of the surface contact connections is configured to be engaged with a corresponding surface contact element of the cDIMM connector.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1A:
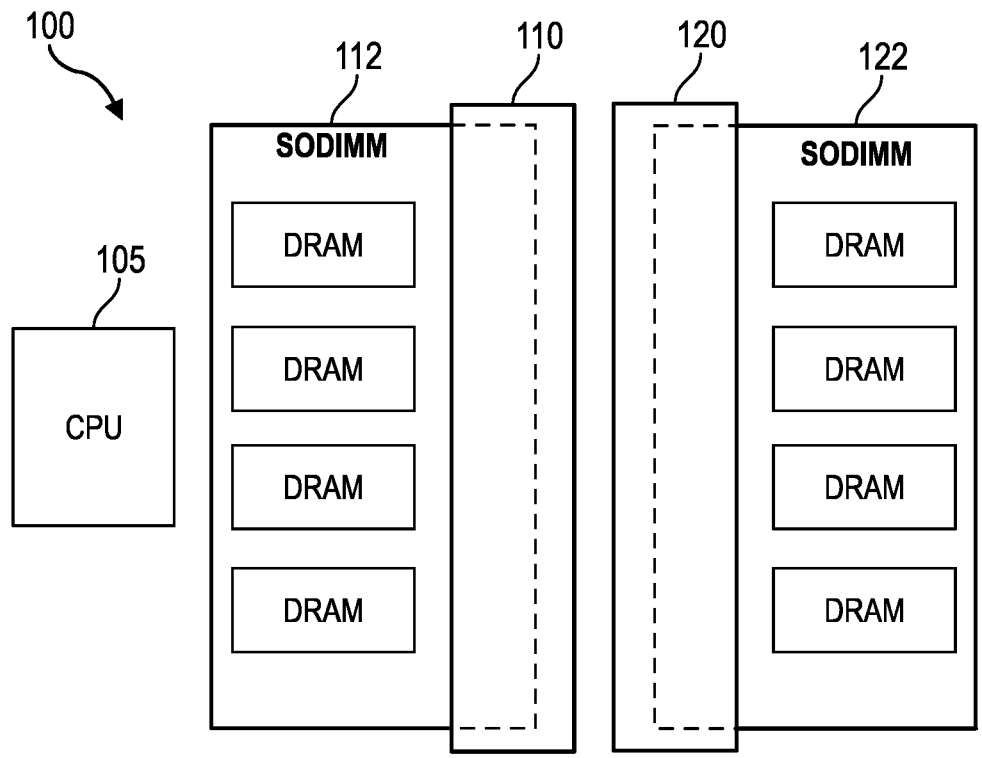
FIGS. 1A-D illustrate diagrams of memory components of conventional Information Handling Systems (IHSs).
Figure 1B:
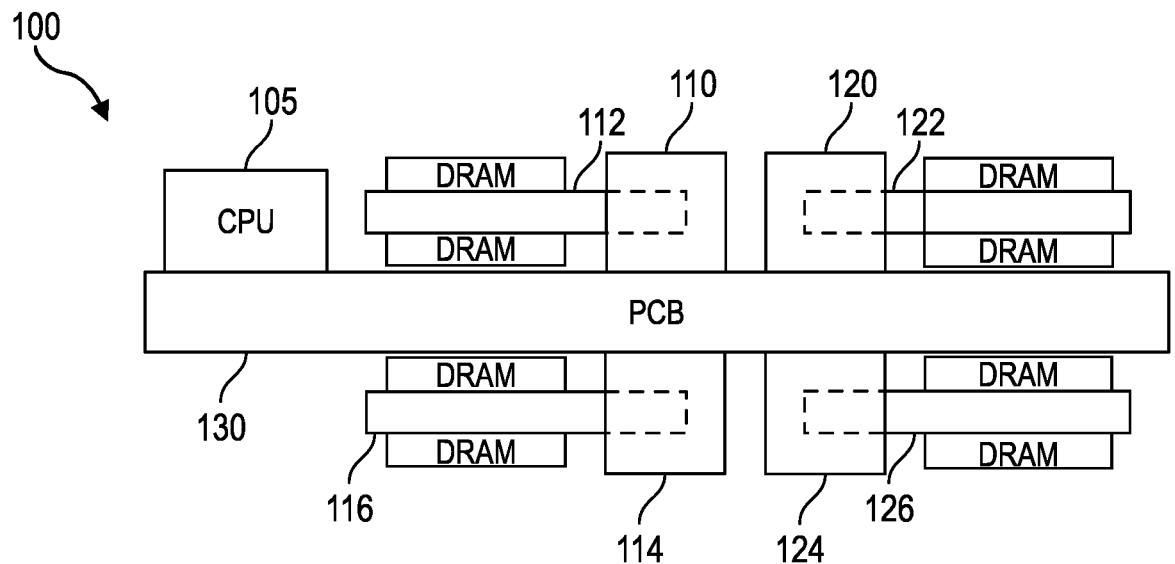

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. As described, an IHS may also include one or more buses operable to transmit communications between the various hardware components. An example of an IHS is described in more detail below.

FIGS. 1A-D illustrate IHSs 100 and 150 of the prior art. Particularly, IHS 100 of FIGS. 1A (top view) and 1B (side view) includes processor (CPU) 105 and Small Outline Dual In-Line Memory Module (SODIMM) connectors 110, 114, 120, and 124 assembled onto Printed Circuit Board (PCB) 130. Connector 110 is populated with SODIMM 112, connector 114 is populated with SODIMM 116, connector 120 is populated with SODIMM 122, and connector 124 is populated with SODIMM 126. SODIMMs 112 and 116 are accessed by processor 105 via a first memory channel, and SODIMMs 122 and 126 are accessed by the processor via a second memory channel, as described further below.

Figure 1C:
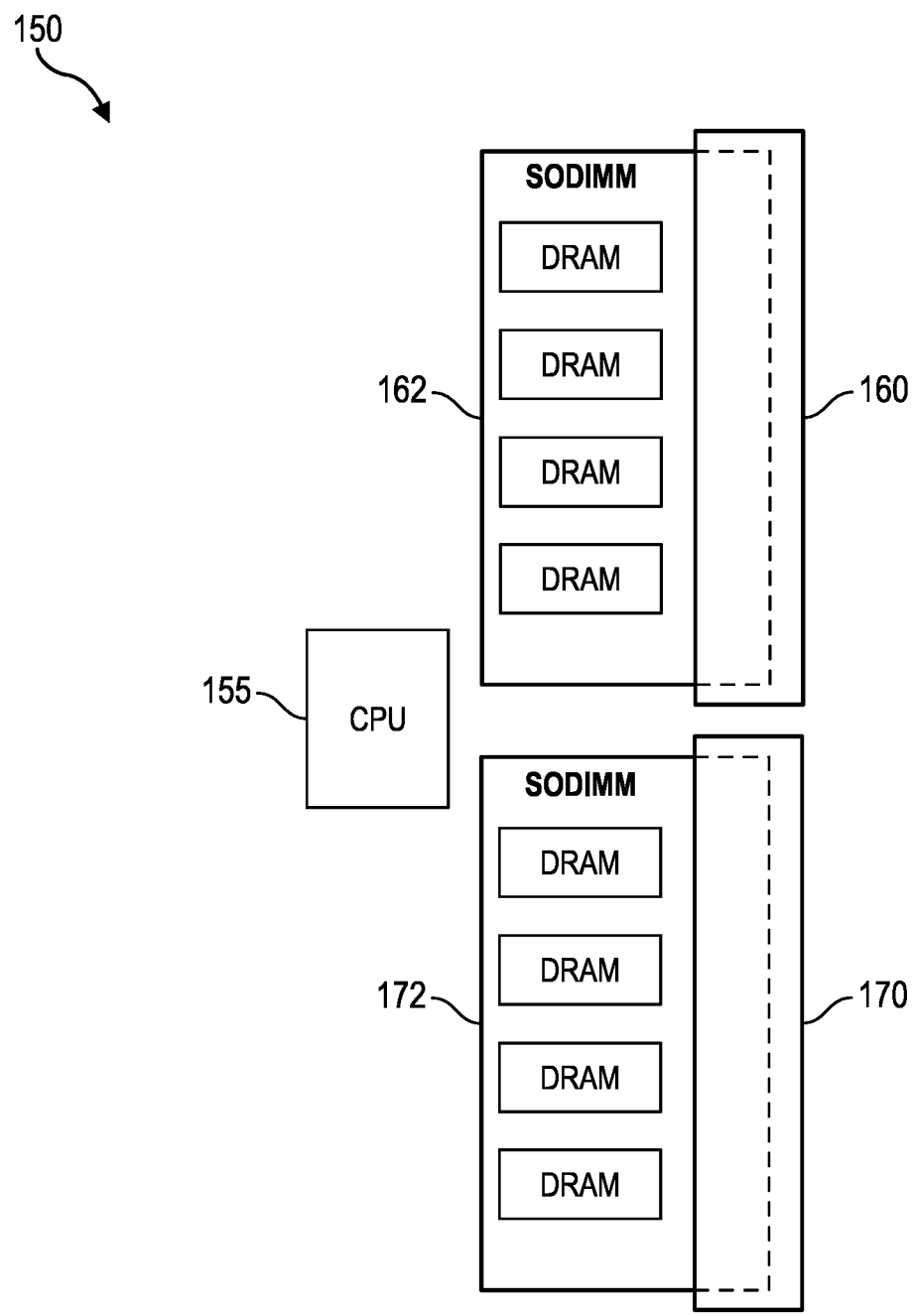
Figure 1D:
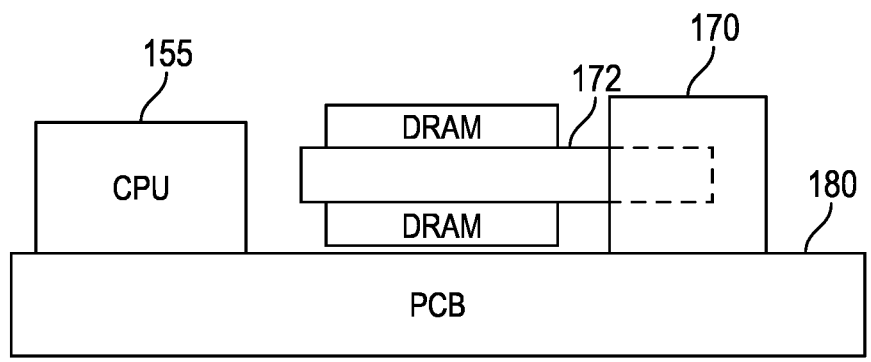

IHS 150 of FIGS. 1C (top view) and 1D (side view) includes processor 155 and SODIMM connectors 160 and 170 assembled onto PCB 180. Connector 160 is populated with SODIMM 162 and connector 170 is populated with SODIMM 172. SODIMM 162 is accessed by processor 155 via a first memory channel, and SODIMM 172 is accessed by the processor via a second memory channel, as described further below.

SODIMMs 112, 116, 122, 126, 162, and 172 represent memory devices for use in IHSs, typically configured in smaller packages than conventional DIMMs. As such, IHSs 100 and 150 may represent small form factor IHSs, such as laptop computers, notebook computers, tablet devices, combination laptop/tablet systems, hand-held devices, smart watches, wearables, and the like. SODIMMs 112, 116, 122, 126, 162, and 172 may be provided in accordance with a particular Double Data Rate (DDR) standard, such as a third generation DDR standard (DDR3), a fourth generation DDR standard (DDR4), or a fifth generation DDR standard (DDR5). As such, processors 105 and 155 may be provided in accordance with a given DDR standard, and all circuit layouts, configurations, and placements may be in accordance with practices permitted or dictated by the given DDR standard.

IHS 100 represents a configuration that typifies higher memory capacity but lower speed systems, compared with IHS 150 that represents a configuration that typifies lower memory capacity but higher speed systems. In particular, IHS 100 having four SODIMMs 112, 116, 122, and 126 results in higher loading on each memory channel, meaning that more power is needed to assert signals on the memory channels, and thus lower speeds are achievable as compared with IHS 150 that only has two SODIMMs 162 and 172; that is, only one SODIMM per memory channel.

In IHS 100, even where not all of connectors 110, 114, 120, and 124 are populated with SODIMMs, the memory channels experience higher loading due to the stub effects of the unpopulated connectors, and so IHS 100 will not typically operate at as high a speed as IHS 150, even when populated similarly to IHS 150. Moreover, connectors 110, 114, 120, 124, 160, and 170 are typically fashioned as some variety of plug-in or plug-and-lock connectors and are not optimized for the highest data speeds that are envisioned for IHSs in the future.

Further, the routing of signal traces in PCBs 130 and 180 are complicated. In particular, in IHS 100, the signal traces, and particularly the signal trace lengths, for each SODIMM on a particular channel must be nearly identical. Thus, the implementation of IHS 100 typically results in highly congested trace routes in PCB 130 in the vicinity of processor 105 and connectors 110, 114, 120, and 124, forcing other traces around the area of congestion, and resulting in higher PCB layer counts to accommodate the congestion. Moreover, where IHS 150 may not need the trace crossings necessitated in IHS 100, the implementation of IHS 150 nevertheless suffers from the need to route traces over a wider area of PCB 180 to reach connectors 160 and 170. Moreover, particularly in the case of IHS 100, a large portion of surface area of a PCB is used up by the placement of the connectors.

Figure 2A:
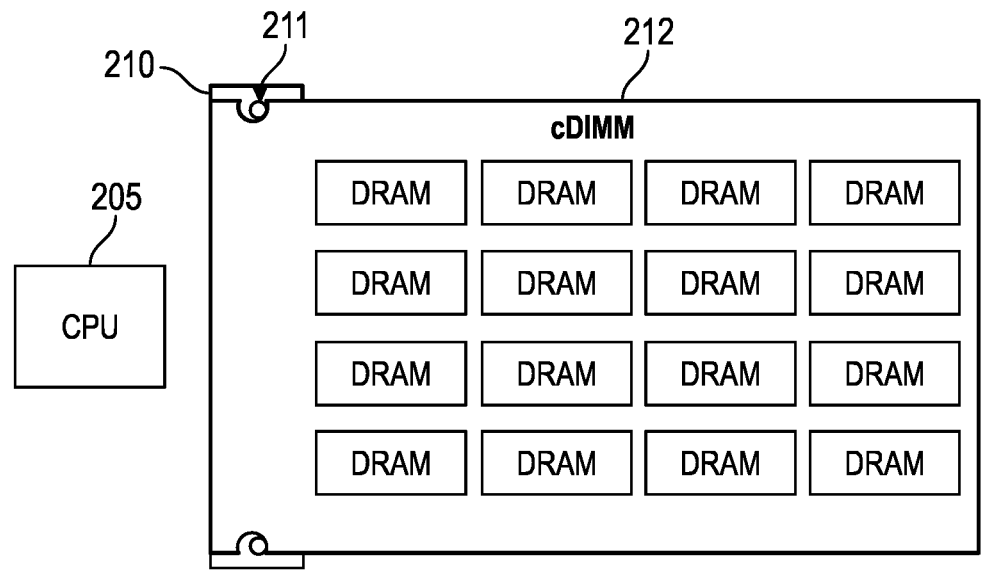
FIG. 2A-D illustrate diagrams of memory components of an IHS according to embodiments of the present disclosure.
Figure 2B:
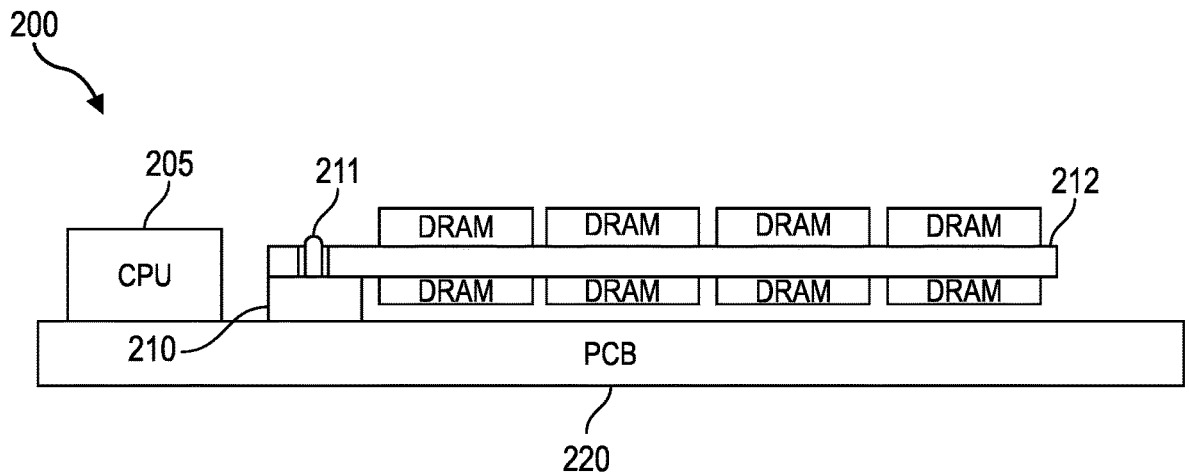

FIGS. 2A (top view) and 2B (side view) illustrates IHS 200 in accordance with an embodiment of the present disclosure. IHS 200 includes processor 205 and compression Dual In-Line Memory Module (cDIMM) cDIMM connector 210 assembled onto PCB 220. cDIMM connector 210 is populated with cDIMM 212.

cDIMM connector 210 represents a z-axis, or "vertical," cDIMM connector that provides a stand-off from PCB 220. cDIMM connector 210 includes separate metal contact elements on a top surface of the connector, one for each signal line and power line. Conversely, cDIMM 212 includes surface contact connections that are compressed to engage with the contact elements. Examples of cDIMM connectors may include cStack or mezzanine-type connectors from AMPHENOL, PCBeam connectors from NEOCONIX, or the like.

In a particular embodiment, cDIMM 212 is accessed by CPU 205 via both a first memory channel and a second memory channel through cDIMM connector 210. In another embodiment, cDIMM 212 is accessed by CPU 205 via only one of the first memory channel or a second memory channel. However, the use of only one memory channel may be based upon a design choice to provide a low-cost design.

In some embodiments, cDIMM connector 210 may include contact elements associated with both memory channels, and cDIMM 212 may configured to utilize only one of the memory channels. Moreover, cDIMM connector 210 and cDIMM 212 include one or more complementary alignment mechanisms 211 that ensure the proper alignment of cDIMM 212 to cDIMM connector 210.

Figure 2C:
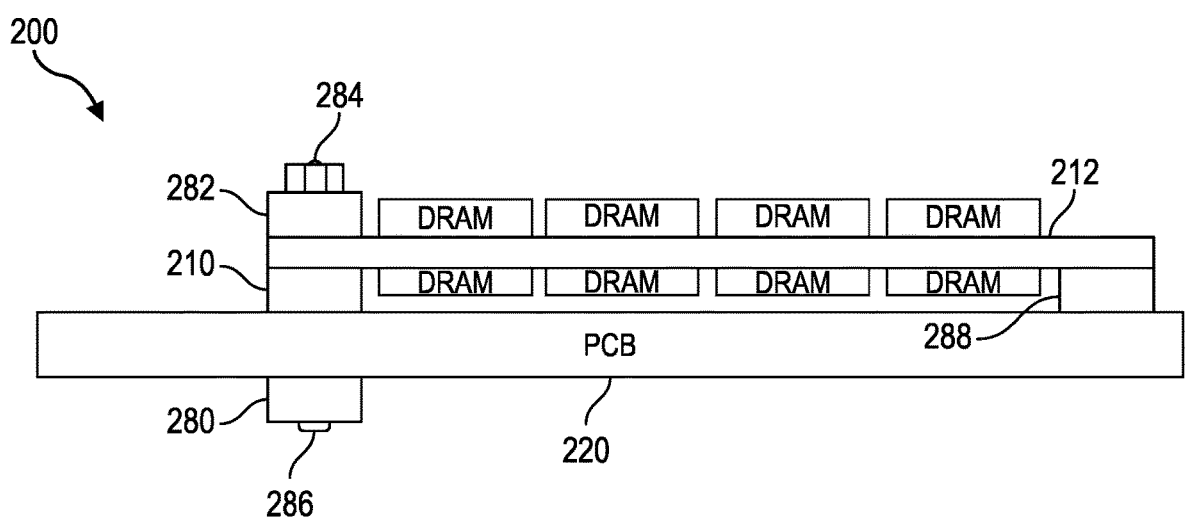

FIG. 2C (side view) illustrates an alternative implementation for attaching cDIMM 212 to connector 210 in accordance with various embodiments. Particularly, backing plate 280 is attached at a bottom side of PCB 220 and bolster 282 is placed on top of cDIMM 212. The contact connections of cDIMM connector 210 are brought into firm contact with the surface contact connections of cDIMM 212 by tightening nut 284 to screw 286 fitted through backing plate 280, PCB 220, connector 210, cDIMM 212, and bolster 282. The screw and nut combination is provided for sake of illustration, and other through-hole attachment mechanisms may be utilized as needed or desired.

In another embodiment, no backing plate is utilized, but the attachment mechanism interfaces directly with the bottom surface of PCB 220. In a particular case, bolster 284 may be fashioned as an L-shaped member to provide sufficient stiffness to the bolster to evenly maintain compression across the surface of cDIMM connector 210. In a particular embodiment, cDIMM connector 210 is surface mount attached (soldered) to the top surface of PCB 220, and cDIMM 212 is removable. In another case, cDIMM connector 210 includes additional metal contact elements on a bottom surface, that is, the surface adjacent to PCB 220, and both the connector and cDIMM 212 are removable.

PCB 220 may include surface contact elements on a top surface of the PCB that are compressed to engage with the contact elements on the bottom side of connector 210. In yet another case, where cDIMM 212 is long, an additional support element 288 is provided to mechanically mount cDIMM 212 and to counter possible adverse effects from having the cDIMM cantilevered from cDIMM connector 210.

Figure 2D:
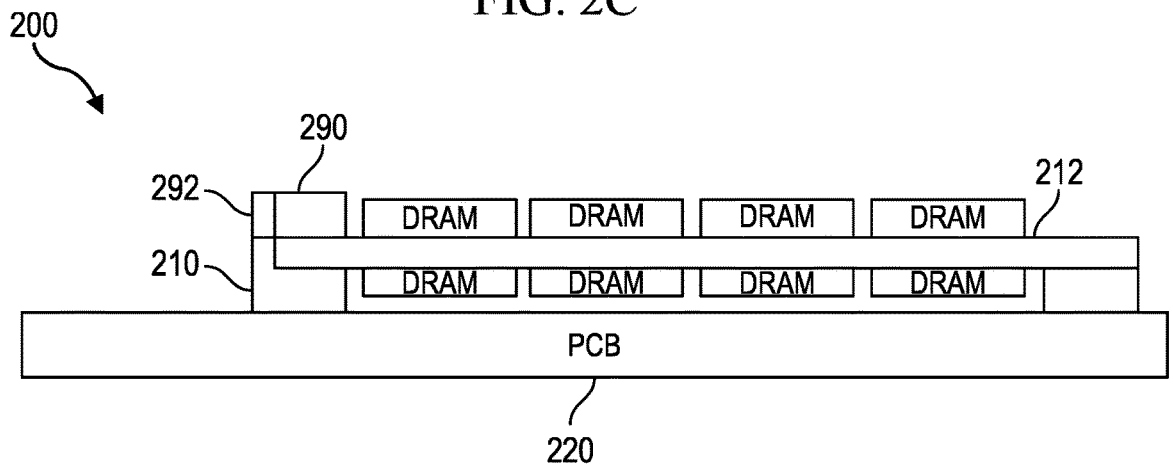

FIG. 2D (side view) illustrates an yet another alternative implementation for attaching cDIMM 212 to cDIMM connector 210 in accordance with various embodiments. Particularly, cDIMM 212 connector 210 includes lever actuated compression device 290 with lever 292. When lever 292 is in a locked position, lever actuated compression device 290 retains cDIMM 212, and when lever 292 is in an open position, lever actuated compression device 290 permits removal of cDIMM 212.

The mechanical arrangements for attaching cDIMM 212 to cDIMM connector 210, as described herein, are illustrative and other mechanisms and arrangements for providing compression mounting of a cDIMM to a cDIMM connector may be utilized in accordance with embodiments.

Figure 3A:
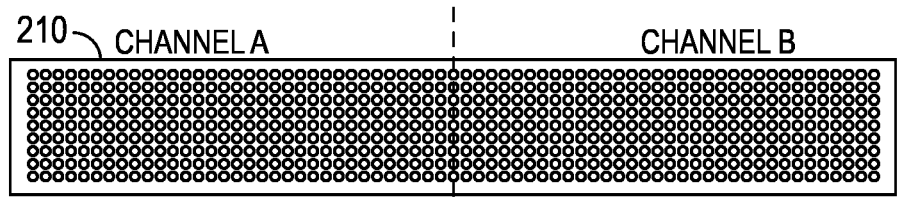
FIGS. 3A-C illustrate a diagram of an example of a cDIMM connector, according to embodiments of the present disclosure.
Figure 3B:
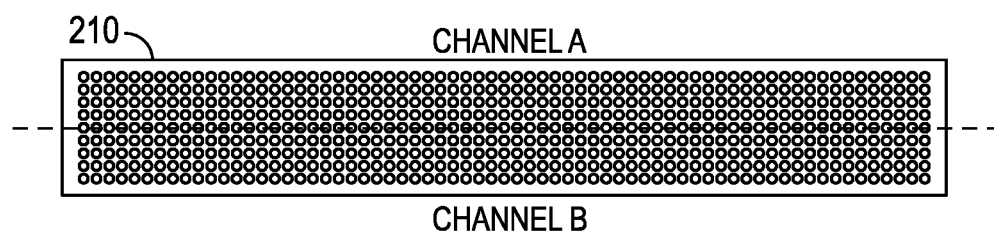
Figure 3C:
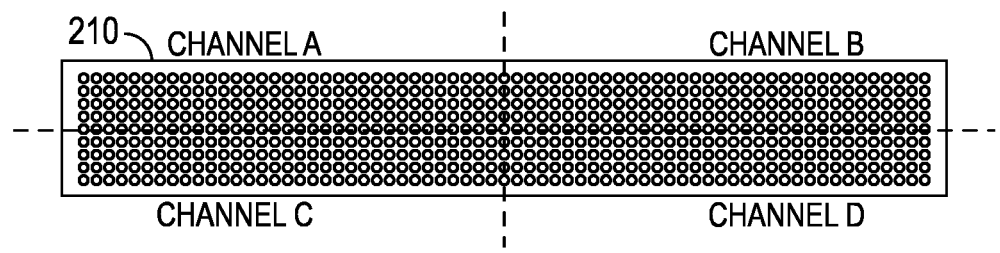

FIGS. 3A-C illustrate cDIMM connector 210 as arranged in various cases. In a particular embodiment, cDIMM connector 210 includes a 9 row×67 column array of contact elements. In a first case, shown in FIG. 3A, the signal contacts for a first memory channel (Channel A) are generally located in a left 33 columns and the signal contacts for a second memory channel (Channel B) are generally located in a right 33 columns.

A middle column may be utilized for common or symmetrical signal or power contacts. Moreover, the arrangement of the signal layout on a PCB for Channel A and Channel B may be mirror-images with respect to a middle column. In this way, cDIMM connector 210 in particular, and the arrangement of cDIMM connector 210 with cDIMM 212, may be reversible in a second aspect so as to minimize the amount of signal trace crossings within PCB 220 when locating the cDIMM connector and the cDIMM in various other orientations with respect to PCB 220, as will be described further below with reference to FIG. 8.

In a second case, shown in FIG. 3B, the signal contacts for a first memory channel (Channel A) are generally located in a top four rows and the signal contacts for a second memory channel (Channel B) are generally located in a bottom four rows. A middle row may be utilized for common or symmetrical signal or power contacts. Moreover, the arrangement of the signal layout on a PCB for Channel A and Channel B may be mirror-images with respect to a middle row. In this way, cDIMM connector 210 in particular, and the arrangement of cDIMM connector 210 with cDIMM 212, may be reversible in a first aspect so as to minimize the amount of signal trace crossings within PCB 220 when locating the cDIMM connector and the cDIMM in various orientations with respect to PCB 220, described below with respect to FIG. 9.

In a third case, shown in FIG. 3C, where cDIMM 212 represents a fifth generation Double Data Rate (DDR5) cDIMM, the contact elements of cDIMM connector 210 and the surface contact connections of the cDIMM include signaling for four memory channels. That is, each of the memory channel "A" and memory channel "B" are be divided into two distinctly operating memory channels, hence memory channels A, B, C, and D. A first pairing of memory channels (e.g., A and B) may be mirror-images of a second pairing of memory channels (e.g., C and D) with respect to a middle column of the connector, and a third pairing of memory channels (e.g., A and C) may be mirror-images of a fourth pairing of memory channels (e.g., B and D) with respect to a middle row of the connector.

Returning to FIG. 2, IHS 200 is similar to IHS 100 in that IHS 200 may represent the same memory capacity as IHS 100. Here, SODIMMs 112, 126, 122, and 136 are each illustrated as including eight DRAM devices. These DRAM devices are only illustrative, however, and typical SODIMMs may include a different number of DRAM devices. IHS 100 may have a memory capacity associated with 32 DRAM devices, where the actual memory capacity is dictated by the density of the DRAM devices. However, where IHS 100 utilizes four SODIMMs and four SODIMM connectors, IHS 200 achieves the same memory capacity on a single cDIMM 212 and utilizing only one cDIMM connector 210.

Here, cDIMM 212 represents a memory device for use in IHSs similarly to SODIMMs 112, 126, 122, and 136, and IHS 200 may typically represent a small form factor IHSs, such as a laptop computer, a notebook computer, an automotive device, a tablet device, a combination laptop/tablet system, a hand-held device, a wearable device, or the like. cDIMM 212 may be provided in accordance with a particular DDR standard, such as DDR3, DDR4, or DDR5, and processor 205 may be provided in accordance with a common DDR standard with the cDIMM.

Figure 4A:
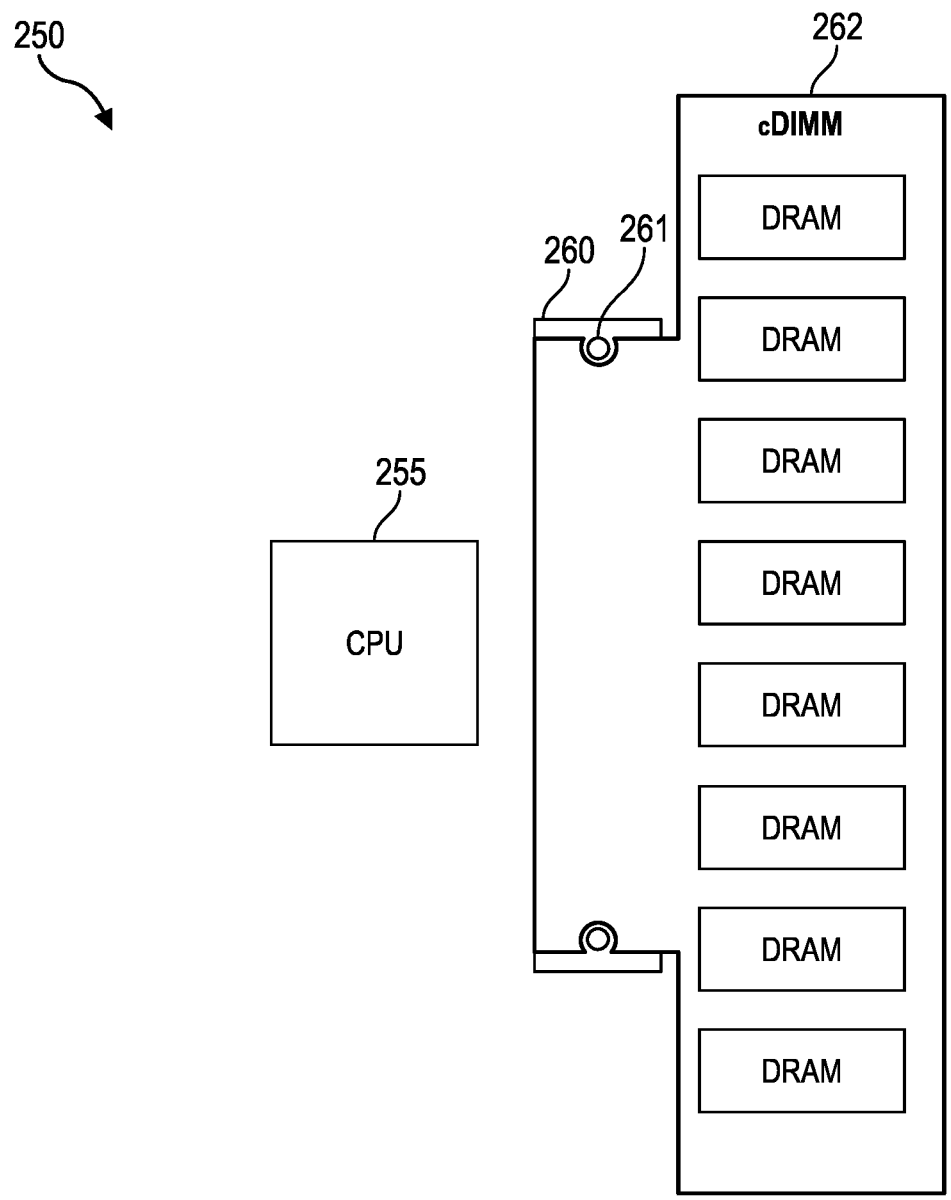
FIGS. 4A and 4B illustrate diagrams of additional aspects of memory components of an IHS, according to embodiments of the present disclosure.
Figure 4B:
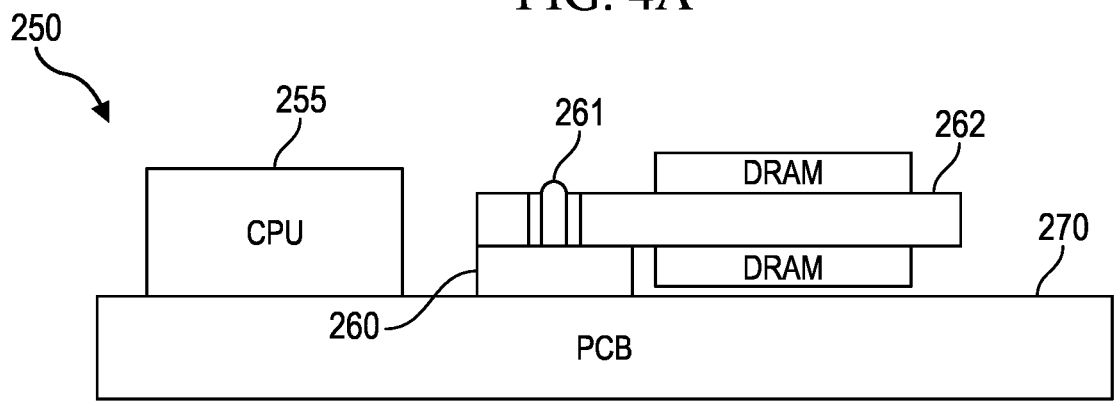

FIGS. 4A (top view) and 4B (side view) illustrate IHS 250 in accordance with an embodiment of the present disclosure. IHS 250 includes processor 255 similar to processor 205 and cDIMM connector 260 assembled onto PCB 270. CDIMM connector 260 is populated with cDIMM 262. The mechanical attachment of cDIMM 262 to cDIMM connector 260 is provided similarly to the attachment of cDIMM 212 to cDIMM connector 260, as described above, and, in a particular embodiment, cDIMM connector 260 and cDIMM 212 may include one or more complementary alignment mechanisms 261 that ensure the proper alignment of cDIMM 212 to cDIMM connector 260. cDIMM 262 may be accessed by CPU 255 via both a first memory channel and a second memory channel through cDIMM connector 260.

IHS 250 is similar to IHS 150, particularly in that IHS 250 may represent the same memory capacity as IHS 150, where IHS 150 has a same memory capacity as IHS 250. However, where IHS 150 utilizes two SODIMMs and two SODIMM connectors, IHS 250 achieves the same memory capacity on a single cDIMM 262 and utilizing only one cDIMM connector 260. Thus cDIMM 262 represents a memory device for use in IHSs similarly to SODIMMs 162 and 176, and IHS 250 may represent a smaller form factor IHS. cDIMM 262 may be provided in accordance with a particular DDR standard, such as DDR3, DDR4, or DDR5, and processor 255 may be provided in accordance with a common DDR standard with the cDIMM.

Figure 5A:
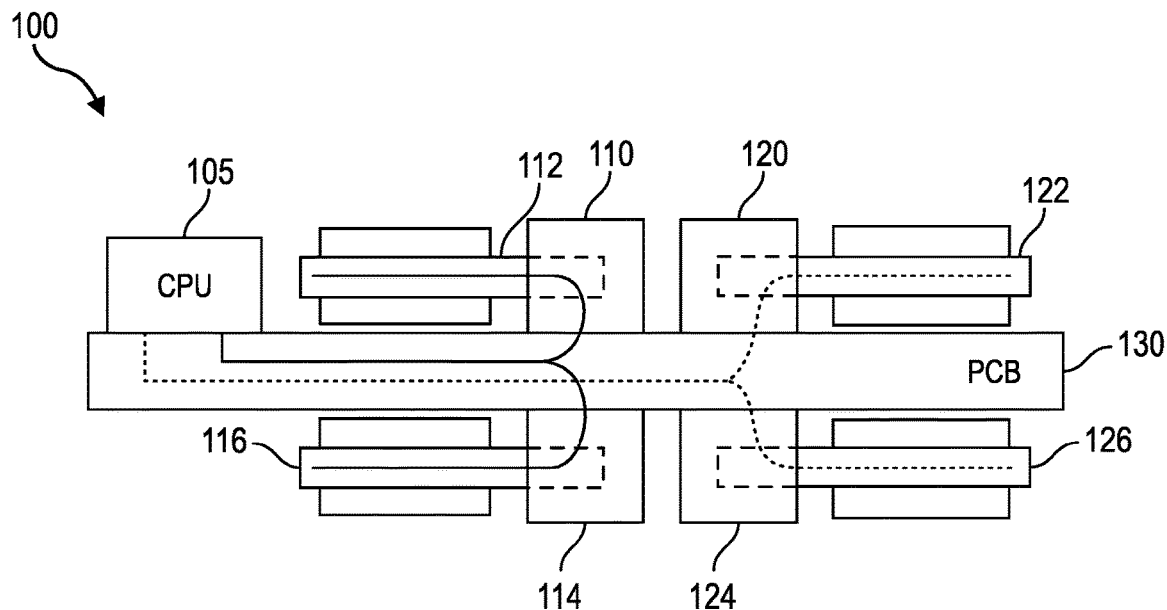
FIGS. 5A-D illustrate diagrams that compare memory channels in the IHS of FIGS. 1A-D with memory channels in the IHS of FIGS. 2A-D and 3A-C, according to embodiments of the present disclosure.
Figure 5B:
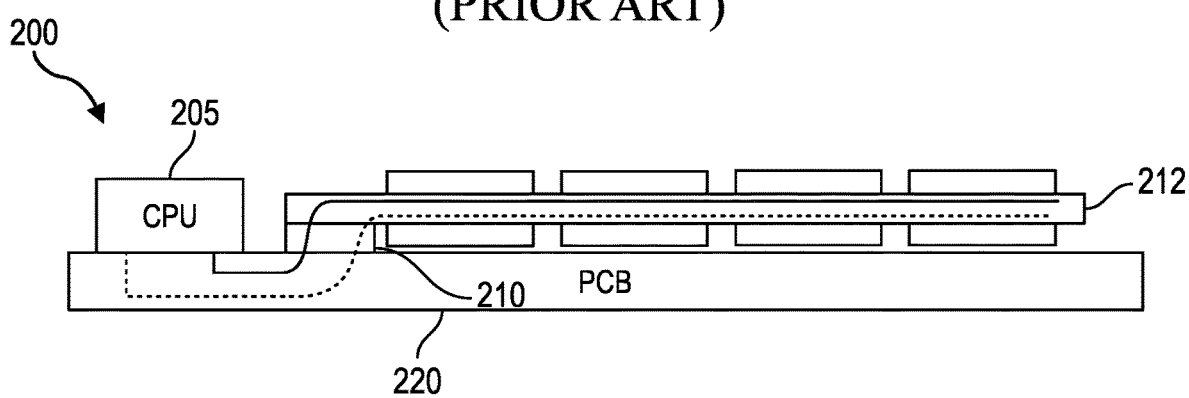
Figure 5C:
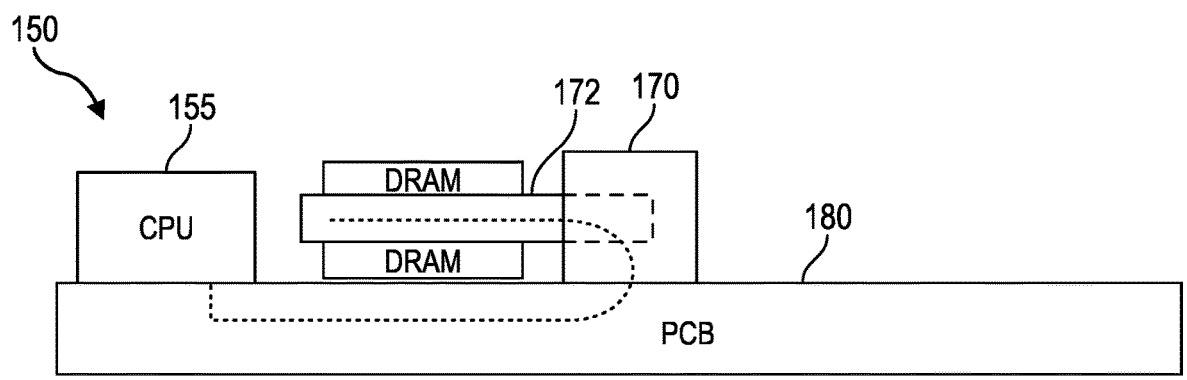
Figure 5D:
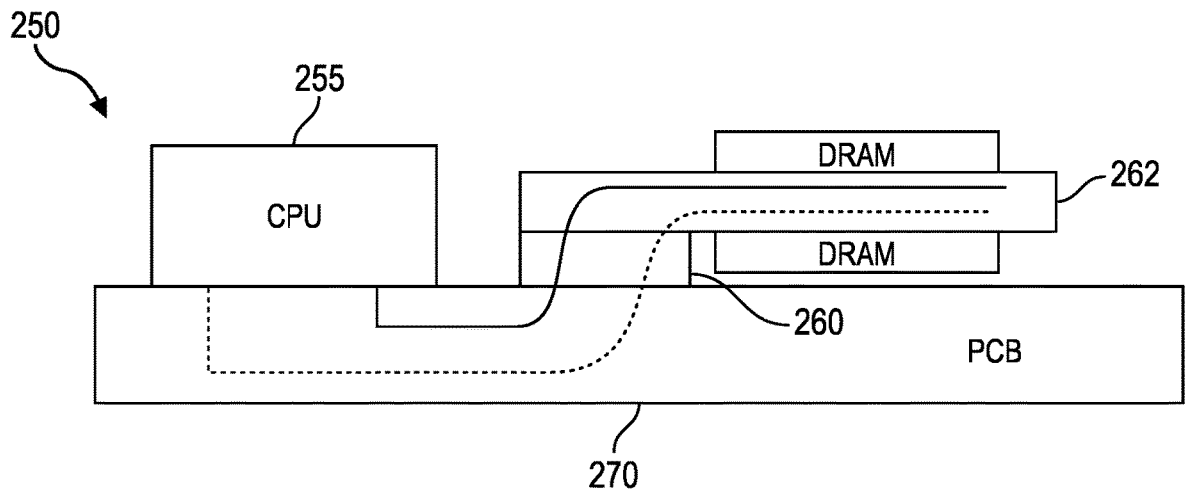

FIGS. 5A-D illustrate memory channels as implemented by IHSs 100 (FIG. 5A) compared with 200 (FIG. 5B), and memory channels as implemented by IHSs 150 (FIG. 5C) compared with 250 (FIG. 5D). In all cases, a first memory channel (Channel A) is shown as a solid line and a second memory channel (Channel B) is shown as a dashed line.

In FIG. 5A, IHS 100 shows where SODIMMs 112 and 116 are accessed via the first memory channel and where SODIMMs 122 and 126 are accessed via the second memory channel. Note that the channel length on the first memory channel is similar for both of SODIMMs 112 and 116, that the channel length on the second memory channel is similar for both of SODIMMs 122 and 126, and that the first memory channel has an overall length that is somewhat shorter than the second memory channel. In this configuration, connector 114 is affixed to PCB 130 below connector 110, and connector 124 is affixed to the PCB below connector 120. In this orientation the configuration of IHS 100 results is extreme congestion and increase PCB layer counts to accommodate all the signal traces on both memory channels to all four connectors.

In contrast, in FIG. 5B, IHS 200 shows that both memory channels are routed through cDIMM connector 210, and no swapping of signal traces is needed in the implementation of IHS 200. In addition, the channel lengths for IHS 200 are significantly shorter than the channel lengths for IHS 100, permitting higher speed operation on IHS 200. Moreover, cDIMM connector technology is more amenable to high-speed operation, with road maps showing support for up to 24 giga-byte (GB) transfer rates, while the plug-in or plug-and-lock type connectors typical for SODIMMs introduce unwanted capacitance and so are not considered suitable for higher data transfer rates. Note that the use of cDIMMs also simplifies the issue of reversibility, as will be described further below.

In FIG. 5C, IHS 150 shows where SODIMM 172 is accessed via the second memory channel. In this case, SODIMM 162 is accessed via the first memory channel, but this is not shown due to SODIMM 162 residing behind SODIMM 172. Both memory channels have a same overall channel length.

In FIG. 5D, cDIMM connector 210 of IHS 250 is mounted closer to processor 255, as compared to the distance between connector 170 and processor 155 on IHS 150, meaning that IHS 250 has shorter channel lengths, and that IHS 250 may operate at higher speed as compared with IHS 150. Moreover, the channel lengths in IHS 250 are shorter than they appear in FIG. 5 because cDIMM connector 210 is mounted on PCB 270 in line with processor 255, while connectors 160 and 170 are mounted on PCB 180 at an offset from processor 155.

Accordingly, as FIGS. 5B and 5D indicate, using systems and methods described herein the routing of memory channels for cDIMMs is greatly simplified as compared with the routing for SODIMMs, and usually leads to shorter memory channels compared with SODIMMs.

FIGS. 6A-D illustrate memory area utilization as implemented by IHSs 100, 150, 200, and 250, respectively. With respect to IHSs 100 and 150 of FIGS. 6A and 6C, the memory areas on the bottom side of SODIMMs 112 and 122, and the memory areas associated with SODIMMs 116 and 126 are not illustrated, and the memory areas on the top and bottom sides of cDIMM 212 are comparable to the memory areas of the SODIMMs. In contrast, in IHS 200 of FIG. 6B, no real estate is utilized for memory on the bottom side of the PCB. IHS 200 gains the real estate area comparable to three of connectors 110, 114, 120, and 124 because there is only one cDIMM connector 210 on IHS 200.

Figure 6A:
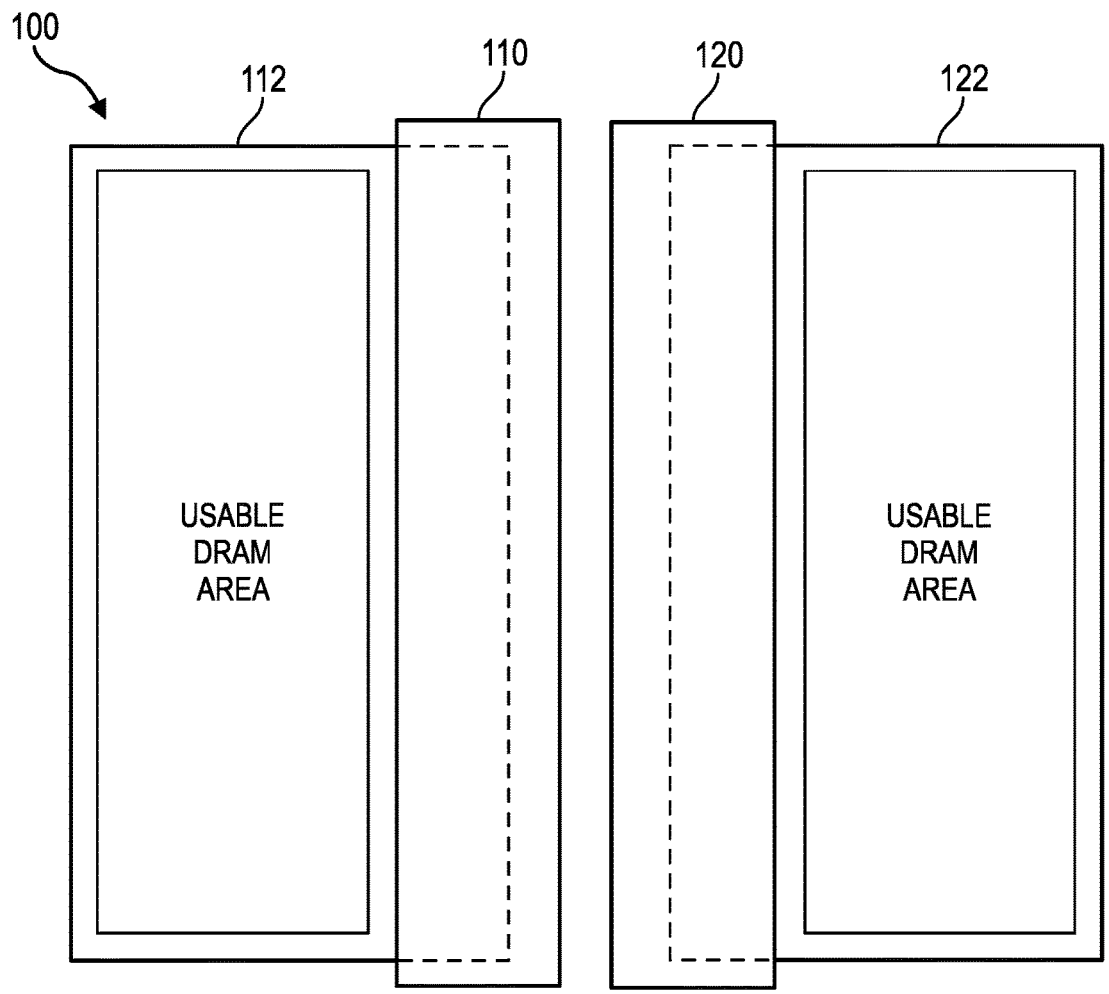
FIGS. 6A-D illustrate diagrams that compare useable memory area(s) in the IHS of FIGS. 1A-D with useable memory area(s) in the IHS of FIGS. 2A-D and 3A-C, according to embodiments of the present disclosure.
Figure 6B:
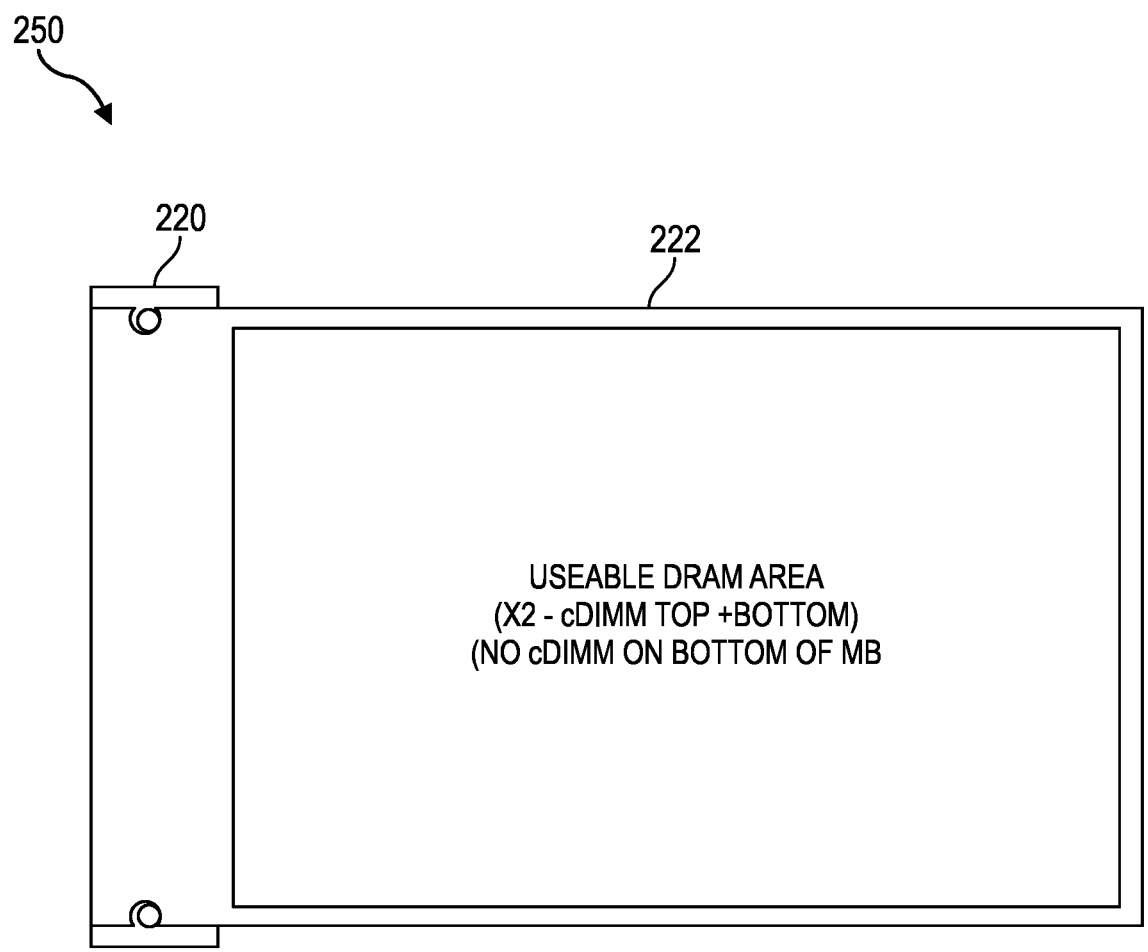
Figure 6C:
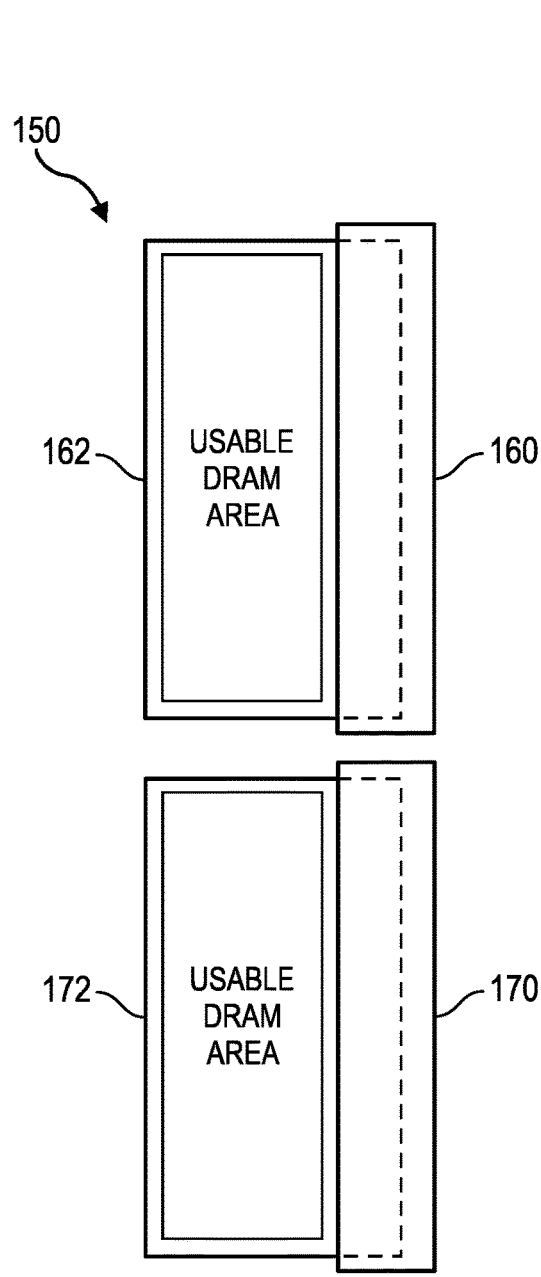
Figure 6D:
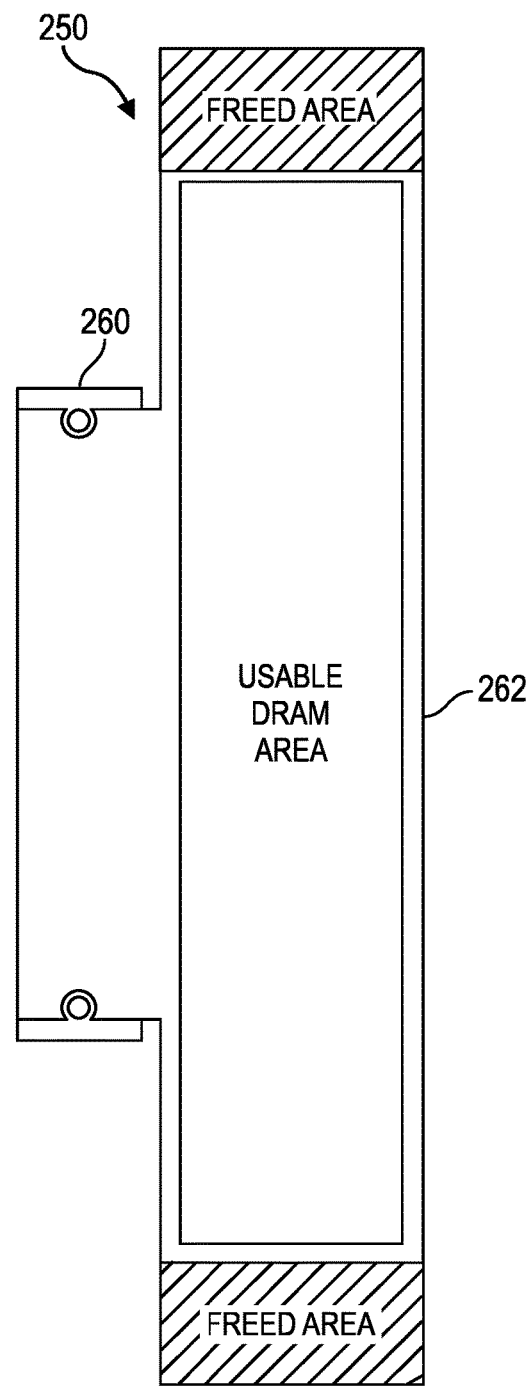

Similarly, with respect to IHSs 150 and 250 of FIGS. 6C and 6D, the memory areas on the bottom of SODIMMs 162 and 172 are not illustrated, and the memory areas on the top and bottom sides of cDIMM 262 is comparable to the memory areas of the SODIMMs. However, in IHS 250, cDIMM 262 does not need to be as wide as the two SODIMMs 162 and 172, and only one cDIMM connector 260 is needed for IHS 250 in the place of the two connectors 160 and 170 of IHS 150.

Figure 7A:
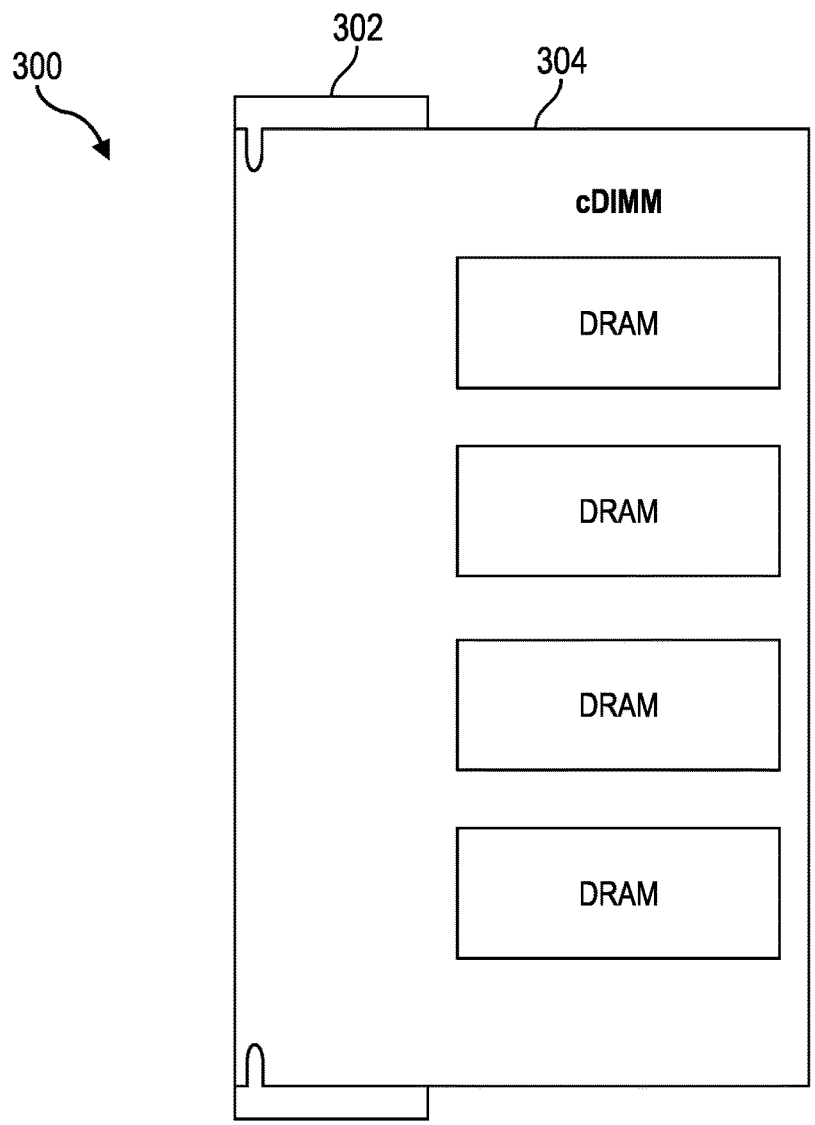
FIGS. 7A-D, 8A-C, 9A-F, 10A-D, 11A-C, 12A, and 12B illustrate diagrams of other aspects of IHSs configured according to other embodiments of the present disclosure.
Figure 7B:
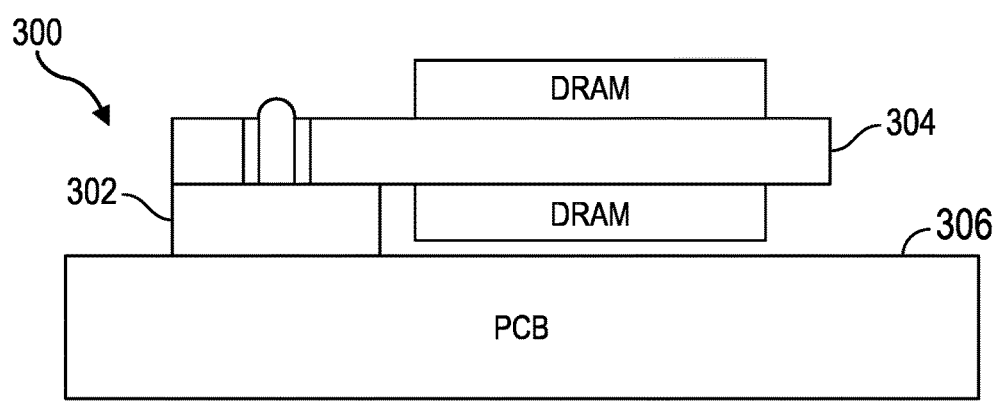

FIGS. 7A (top view) and 7B (side view) illustrate memory scalability utilizing cDIMMs. In this embodiment, IHS 300 includes cDIMM connector 302 mounted on PCB 306, and into which cDIMM 304 is populated. Here, cDIMM 304 represents a small capacity cDIMM, having half the usable area of cDIMM 262 as illustrated in FIG. 4A. IHS 300 may be typical of a small form factor IHS, where the area of PCB 306 is highly constrained. IHS 300 may further be typical of a very high-performance IHS, because the memory channels of cDIMM 304 are generally shorter than the memory channels of cDIMM 262.

Figure 7C:
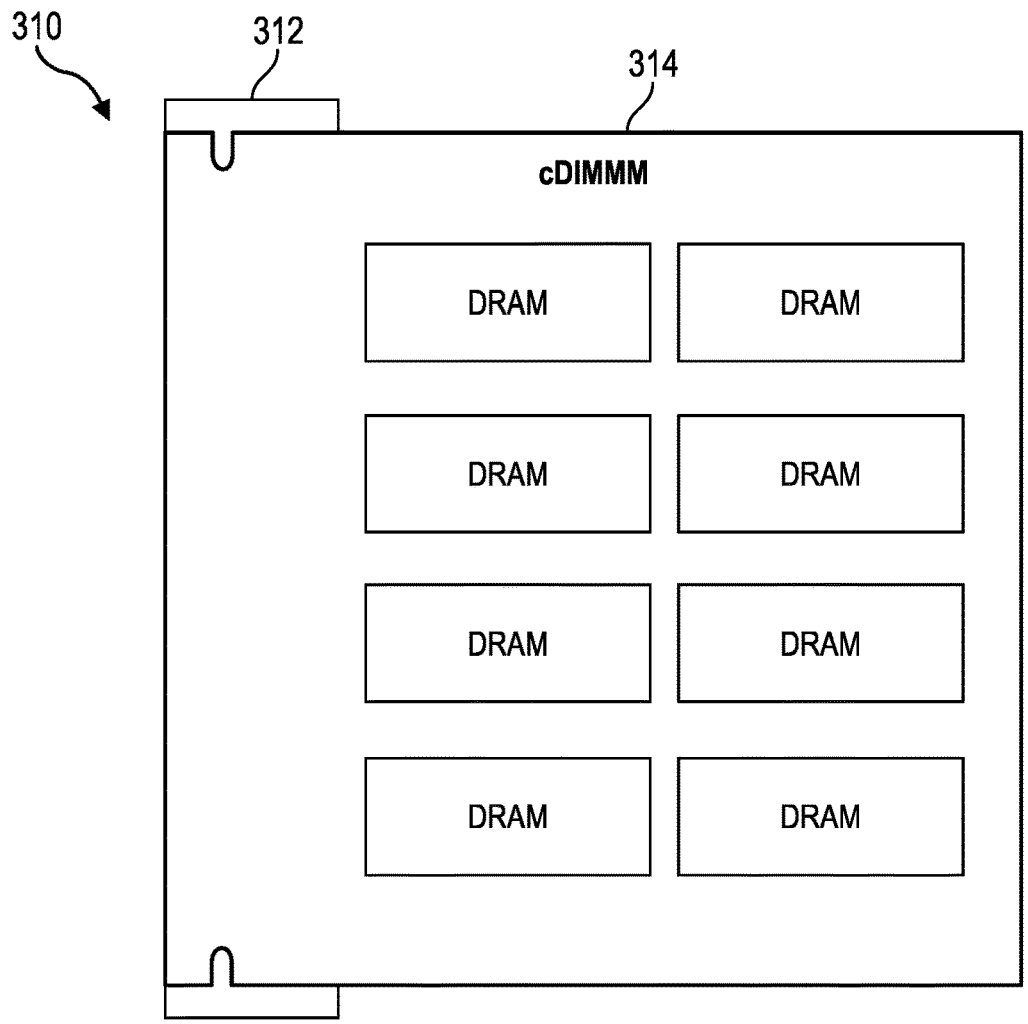
Figure 7D:
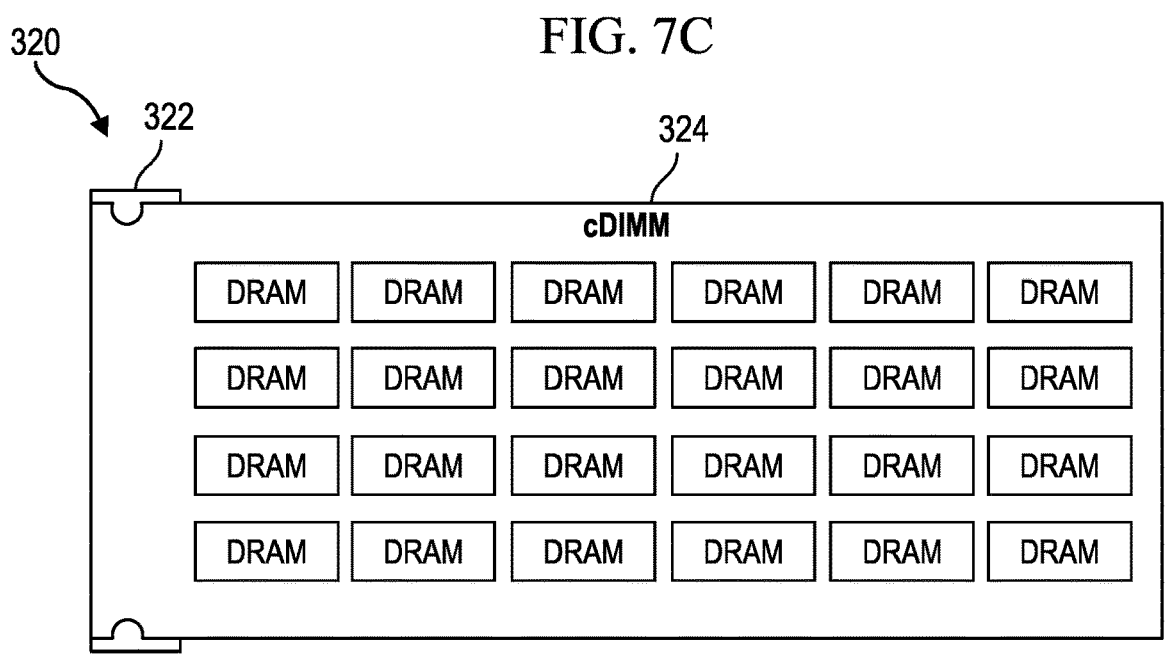

In FIG. 7C, IHS 310 includes cDIMM connector 312 into which cDIMM 314 is populated. Here, cDIMM 314 represents a cDIMM with a similar usable area to cDIMM 262, but arranged in a different footprint. In FIG. 7D, IHS 320 includes cDIMM connector 322 into which cDIMM 324 is populated. Here, cDIMM 324 represents a cDIMM high capacity cDIMM with a larger usable area than cDIMM 212 illustrated in FIG. 2A.

Hence FIGS. 7A-D illustrate that the use of cDIMMs is both more readily scalable than comparable configurations that utilize SODIMMs, and that the configurations of cDIMMs are more flexible. For example, a cDIMM with a capacity comparable to cDIMM 324 may be configured with the DRAMs arranged in three columns of eight DRAMs each, making a taller but shorter cDIMM configuration. Other configurations may be utilized as needed or desired.

Figure 8A:
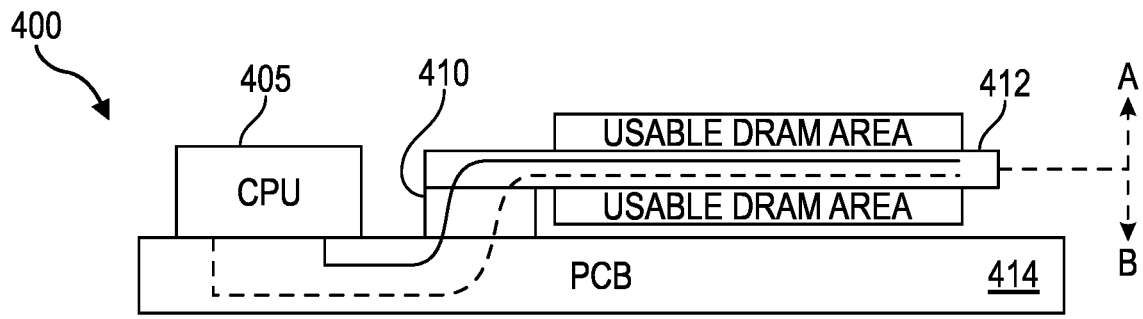
Figure 8B:
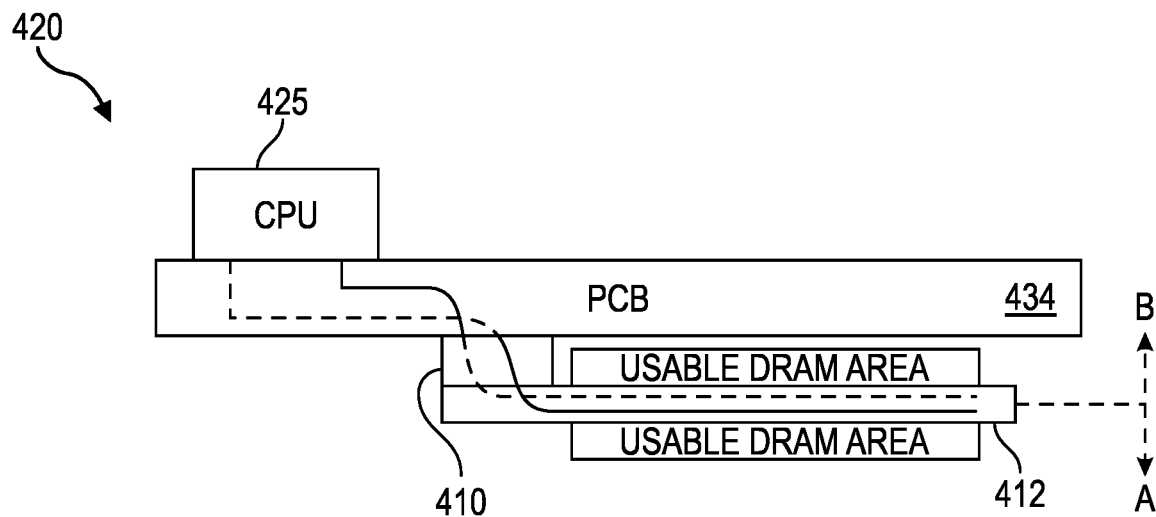
Figure 8C:
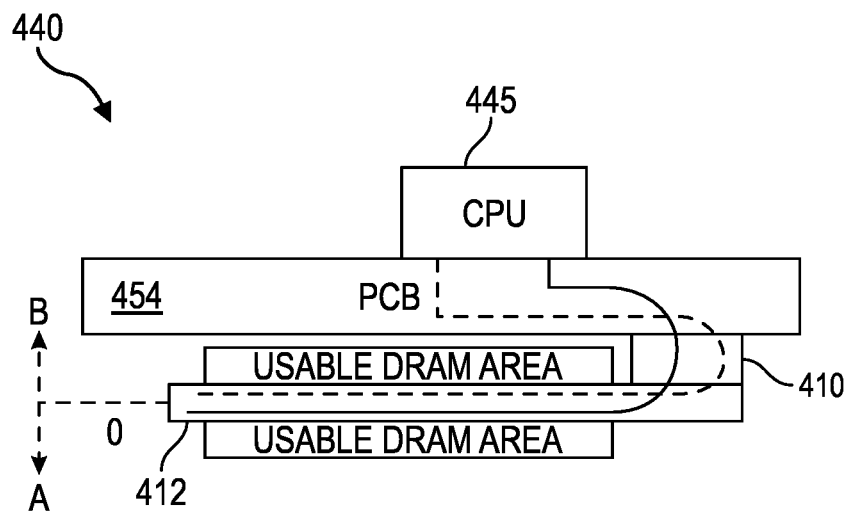

FIGS. 8A-C illustrate memory reversibility utilizing cDIMMs and cDIMM connectors in various configurations utilizing signal layouts associated with embodiments shown in FIG. 3A. In FIG. 8A, IHS 400 includes processor 405, cDIMM connector 410 mounted on PCB 414, and into which cDIMM 412 is populated. IHS 400 is similar to IHSs 200 and 250, in that both memory channels are routed through cDIMM connector 410. Note that the first memory channel is routed to an outside, or top side, of cDIMM 412, labeled side "A," and that the second memory channel is routed to an inside, or bottom side of the cDIMM, labeled side "B." Here, in terms of memory channel layout in PCB 414, and the initialization of cDIMM 412, such as during a Memory Reference Code (MRC) portion of a system boot process for IHS 400, the configuration can be deemed a standard configuration.

In FIG. 8B, IHS 420 includes processor 425, cDIMM connector 410 mounted on PCB 434, and into which cDIMM 412 is populated. Here, cDIMM connector 410 and cDIMM 412 have been inverted and mounted on the underside of PCB 434. Similarly to IHS 400, both memory channels are routed through cDIMM connector 410. However, because a memory channel layout as depicted in FIG. 3A is arranged such that the memory channels are mirror-images with respect to a middle column of connector 410, no swapping of signal traces is needed in the implementation of IHS 420. That is, the memory channel layout for IHS 420 may be similar to the memory channel layout for IHS 400 such that, where the contact pads in PCB 414 are on the top side of the PCB, the contact pads in PCB 434 are on the bottom side of the PCB.

Note, however, that the first memory channel is routed to the inside of cDIMM 412 (side "B"), and that the second memory channel is routed to the outside of the cDIMM (side "A") in IHS 420. Thus, in terms of memory channel layout, the standard configuration is suitable for both IHS 400 and IHS 420. The crossing of the memory channels on PCB 434 with cDIMM 412, as shown in IHS 420 may be handled by reconfiguration of the MRC for IHS 420 as compared with the MRC for IHS 400. However, where the arrangement of the contact connections of cDIMM 412 are designed symmetrically between the memory channels, there may be no need for any changes in the MRC to accommodate the configuration of IHS 420.

In FIG. 8C, IHS 440 includes a processor 445, cDIMM connector 410 mounted on a PCB 454, and into which cDIMM 412 is populated. Here, cDIMM connector 410 and cDIMM 412 have not only been inverted and mounted on the underside of PCB 454, but also have been rotated 180 degrees on the surface of the PCB. As with IHS 400 and IHS 420, both memory channels are routed through cDIMM connector 410.

Because a memory channel layout as depicted in the embodiment of FIG. 3 is arranged such that the memory channels are mirror-images with respect to a middle column of connector 410, no swapping of signal traces is needed in the implementation of IHS 440. That is, the memory channel layout for IHS 440 may be similar to the memory channel layout for IHS 400 such that, where the contact pads in PCB 414 are on the top side of the PCB, the contact pads in PCB 454 are on the bottom side of the PCB. As such, the only difference between PCB 414 and PCB 454 may be that the memory channel vias in PCB 414 that make up the contact pads for cDIMM connector 410 are routed to the top of PCB 414, while the memory channel vias in PCB 454 that make up the contact pads for the cDIMM connector are routed to the bottom of PCB 454.

Note here that the first memory channel is routed to the outside of cDIMM 412 (side "A"), and that the second memory channel is routed to the inside of the cDIMM (side "B"), and that the memory devices accessed by each memory channel are the same in IHS 440 as in IHS 400, and both IHS 400 and IHS 440 can use a common MRC. Thus, it will be noted that the use of cDIMMs greatly simplifies reversibility as compared with similar IHSs that utilize SODIMMS.

Figure 9A:
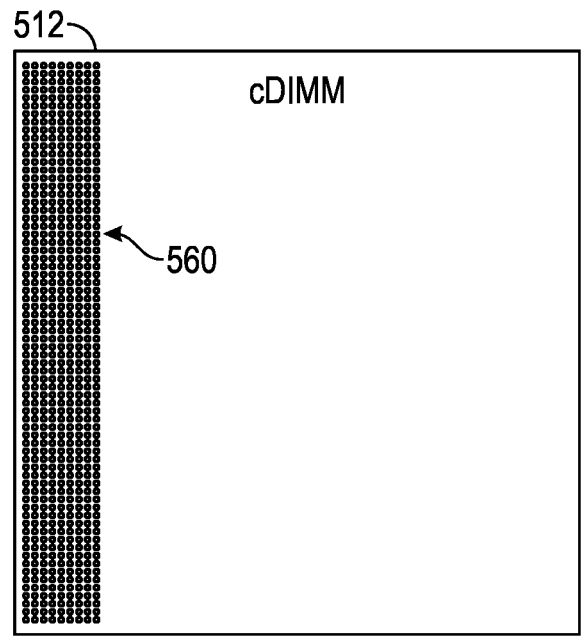
Figure 9B:
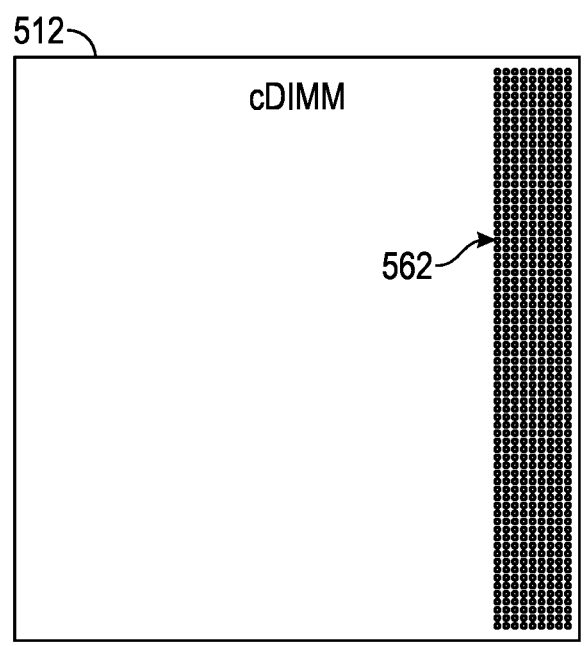

FIGS. 9A-F illustrate further memory reversibility utilizing cDIMMs and cDIMM connectors in various configurations utilizing signal layouts associated embodiments shown in FIG. 3B. In FIG. 9A (bottom view), cDIMM 512 is illustrated as having contact array 560, as would be found on a bottom side of any of the previously described cDIMMs. In FIG. 9B (top view), cDIMM 512 is illustrated as having a further contact array 562 on the top side of the cDIMM. Here, contact array 560 and contact array 562 may be arranged such that each contact in contact array 560 is directly in line with the associated contact in contact array 562. For example, a PCB of cDIMM 512 may be fabricated such that each contact in contact array 560 is directly connected to the associated contact in contact array 562 using a via between the top and bottom sides of the PCB.

Figure 9C:
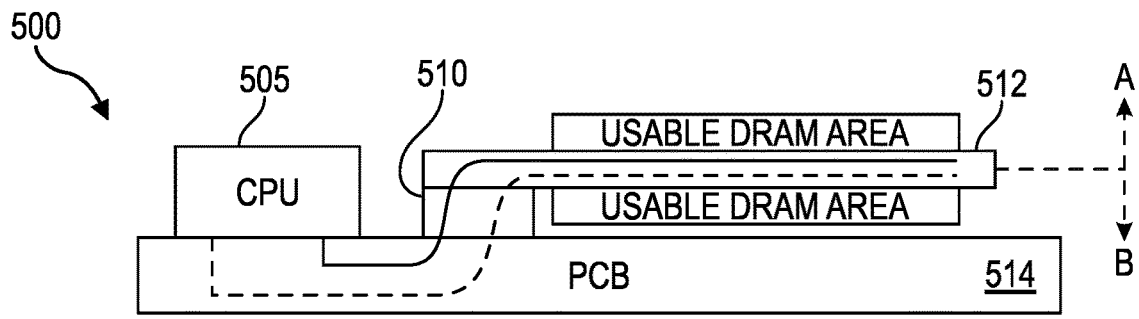

In FIG. 9C, IHS 500 includes processor 505, cDIMM connector 510 mounted on PCB 514, and into which cDIMM 512 is populated. IHS 500 is similar to IHSs 200, 250, and 400, in that both memory channels are routed through cDIMM connector 510, and IHS 500 is arranged in the standard configuration. Here, cDIMM 512 is connected to cDIMM connector 510 by contact array 560. Thus, the first memory channel is routed to an outside, or top side, of cDIMM 512, labeled side "A," and the second memory channel is routed to an inside, or bottom side of the cDIMM, labeled side "B." Further, the initialization of cDIMM 512, such as during a Memory Reference Code (MRC) portion of a system boot process for IHS 500, can be in accordance with the standard configuration.

Figure 9D:
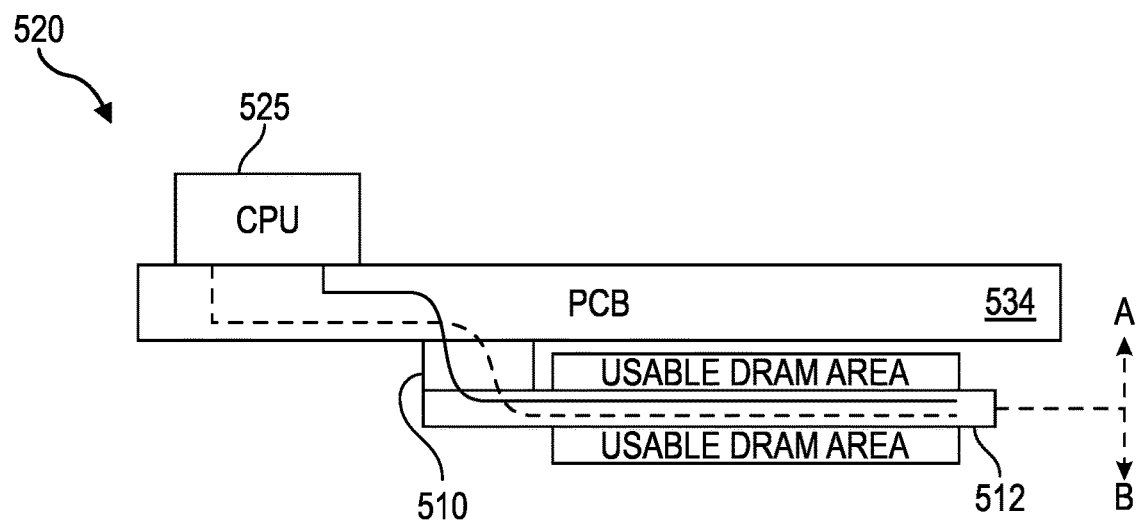

In FIG. 9D, IHS 520 includes processor 525, cDIMM connector 510 mounted on PCB 534, and into which cDIMM 512 is populated. Here, cDIMM connector 510 and cDIMM 512 are mounted on the underside of PCB 534, but no left-to-right swapping is needed because cDIMM 512 is connected to cDIMM connector 510 by contact array 562 such that the first memory channel is routed to the inside of cDIMM 512 (side "A") and the second memory channel is routed to the outside of the cDIMM (side "B"). Thus, the memory channel layout for IHS 520 may be identical to the memory channel layout for IHS 500, except that, where the contact pads in PCB 514 are on the top side of the PCB, the contact pads in PCB 534 are on the bottom side of the PCB. As such, the only difference between PCB 514 and PCB 534 may be that the memory channel vias in PCB 514 that make up the contact pads for cDIMM connector 510 are routed to the top of PCB 514, while the memory channel vias in PCB 534 that make up the contact pads for the cDIMM connector are routed to the bottom of PCB 534.

Figure 9E:
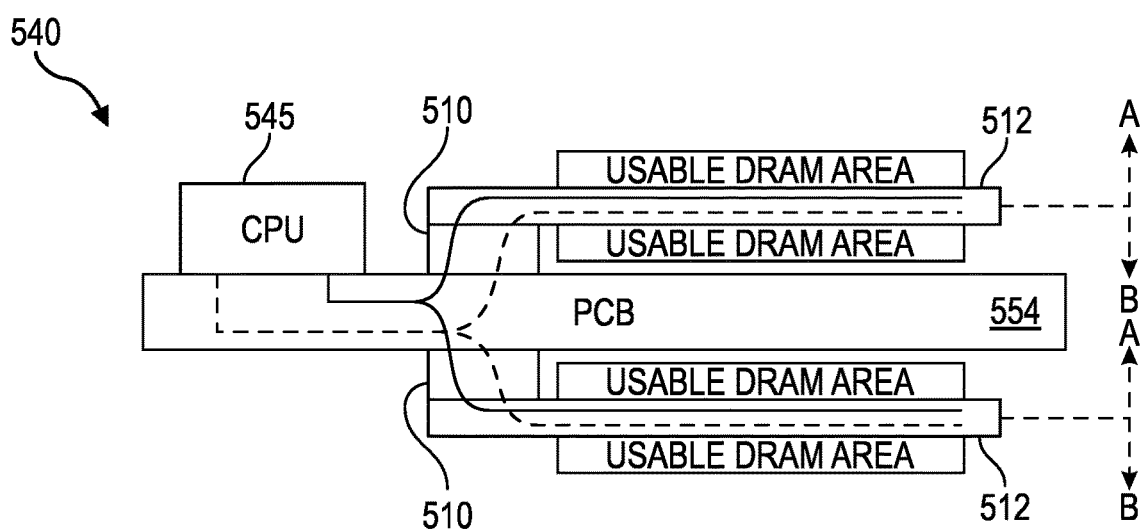

In FIG. 9E, IHS 540 includes processor 545, a pair of cDIMM connectors 510, one mounted on a top side of a PCB 554, and the other mounted on a bottom side of the PCB, and into which a pair of cDIMMs 512 are mounted, one into the cDIMM connector on the top side of the PCB, and the other into the cDIMM connector on the bottom side of the PCB. Here, the memory channel routing may only differ in that the contacts in PCB 554 are connected together on the top and bottom sides of the PCB, such as by vias through the PCB.

Figure 9F:
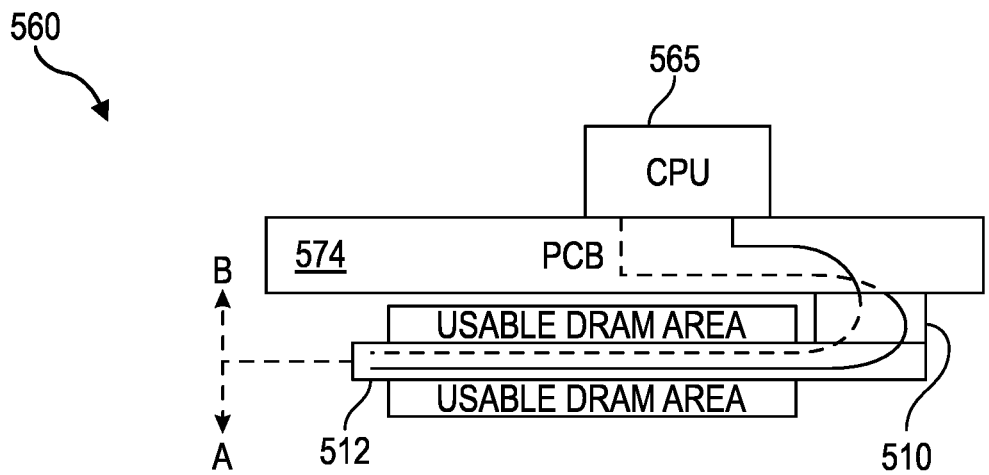

In FIG. 9F, IHS 560 includes processor 565, cDIMM connector 510 mounted on PCB 574, and into which cDIMM 512 is populated. Here, cDIMM connector 510 and cDIMM 512 have been inverted and mounted on the underside of PCB 574, and also have been rotated 180 degrees on the surface of the PCB. As with IHS 500, IHS 520, and IHS 540, both memory channels are routed through cDIMM connector 510.

Again, because a memory channel layout as depicted in the embodiment of FIG. 3B is arranged such that the memory channels are mirror-images with respect to a middle row of connector 510, the memory channel layout for IHS 560 may be similar to the memory channel layout for IHS 500 such that, where the contact pads in PCB 514 are on the top side of the PCB, the contact pads in PCB 574 are on the bottom side of the PCB. As such, the only difference between PCB 514 and PCB 574 may be that the memory channel vias in PCB 514 that make up the contact pads for cDIMM connector 510 are routed to the top of PCB 514, while the memory channel vias in PCB 574 that make up the contact pads for the cDIMM connector are routed to the bottom of PCB 574.

Note here that the first memory channel is routed to the inside of cDIMM 512 (side "B"), and that the second memory channel is routed to the outside of the cDIMM (side "A"), and the memory devices accessed by each memory channel are the different in IHS 560 from IHS 500. Thus, IHS 560 may use a different MRC.

Thus, the arrangement of cDIMM 512, with contacts on a top and bottom side of the cDIMM, provides greater flexibility in the placement of cDIMMs within an IHS, while allowing for a single arrangement for the memory channel traces in the PCB. That is, a common arrangement for memory channel traces within a PCB may admit to the placement of cDIMMs on a top side of the PCB, on the bottom side of the PCB, on both sides of the PCB, and rotated on the bottom side of the PCB, with only the placement of the contacts at the surface of the PCB being arranged differently. In fact, a layout that provides contacts on both the top side of the PCB and the bottom side of the PCB provides ultimate flexibility in cDIMM placement.

FIGS. 10A-D illustrate the use of cDIMMs in various configurations. Particularly, in FIG. 10A, IHS 600 includes processor 605, a pair of cDIMM connectors 610 and 614, and a pair of cDIMMs 612 and 616. Here, cDIMM connector 610 is mounted to PCB 614, into which cDIMM 612 is installed. cDIMM 612 is similar to cDIMM 512 of FIGS. 9A-F, having contact arrays on both the top side and the bottom side of the cDIMM. CDIMM connector 614 is then mounted to the top side of cDIMM 612, into which cDIMM 616 is mounted. Here, cDIMM 616 may be similar to cDIMM 512, or may be similar to cDIMM 412 of FIGS. 8A-C, having a contact array on only the bottom side of the cDIMM.

Note here that the depth of cDIMM connector 612 is similar to cDIMM connectors 210, 410, and 510, and is typically provided with a depth that allows for the DRAMs on the bottom side of cDIMM 612 to clear PCB 618, and may be sufficient to permit air to flow around the DRAMs, as needed or desired. In this regard, the depth of cDIMM connectors 210, 410, 510, and 610 may be considered to be a standard dimension. On the other hand, cDIMM connector 614 may be provided with a depth that allows for DRAMs on the top side of cDIMM 612 to clear the DRAMs on the bottom side of cDIMM 616, and may be sufficient to permit air to flow around the DRAMs, as needed or desired. In this regard, the depth of cDIMM connector 614 may be different from the dimension of cDIMM connector 610.

Figure 10A:
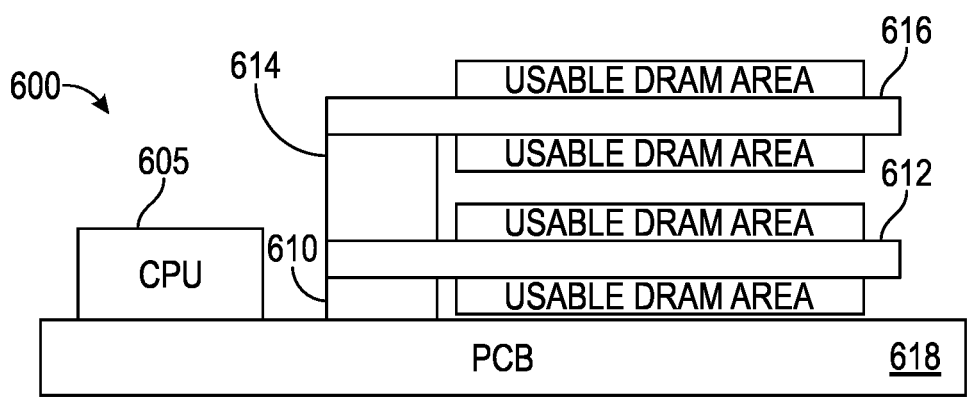
Figure 10B:
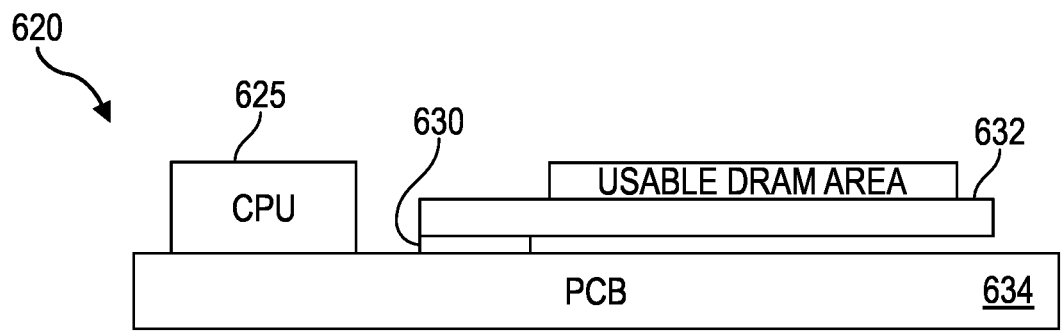
Figure 10C:
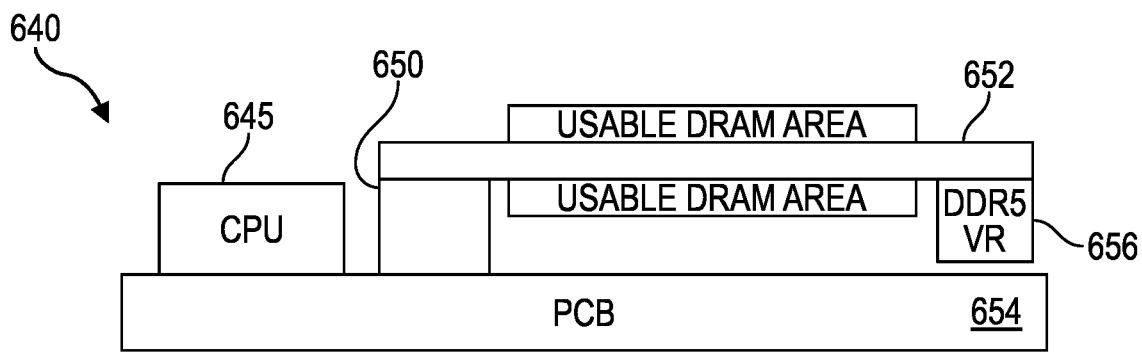
Figure 10D:
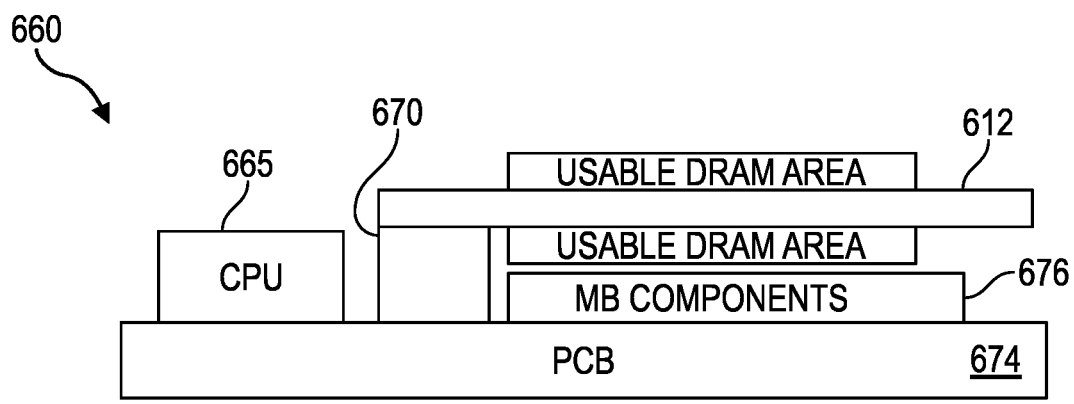

FIGS. 10B-D further illustrate different embodiments of IHSs with varying depths of cDIMM connectors. In FIG. 10B, IHS 620 includes processor 625 and cDIMM connector 630 mounted onto PCB 634, and into which cDIMM 632 is installed. CDIMM connector 630 represents a reduced depth cDIMM connector that may be suitable where, as illustrated, cDIMM 634 is only populated with DRAMs on a top side of the cDIMM. Here, cDIMM connector 630 is provided with a sufficient depth to clear PCB 634. Thus, IHS 620 permits a reduced overall depth typical for use in ultra-slim devices.

In FIG. 10C, HS 640 includes processor 645 and cDIMM connector 650 mounted onto PCB 654, and into which cDIMM 652 is installed. CDIMM connector 630 represents an increased depth cDIMM connector. Here, cDIMM 654 is a DDR5 cDIMM that includes an on-board voltage regulator (VR) 656 device that may typically have a higher profile than the DRAMs on the cDIMM. Thus cDIMM connector 650 has an increased depth to accommodate VR 656.

In FIG. 10D, IHS 660 includes a processor 665 and a cDIMM connector 670 mounted onto a PCB 674, and into which a cDIMM 672 is installed. CDIMM connector 630 represents an increased depth cDIMM connector to accommodate for the placement of various motherboard components 676 on PCB 674.

Figure 11A:
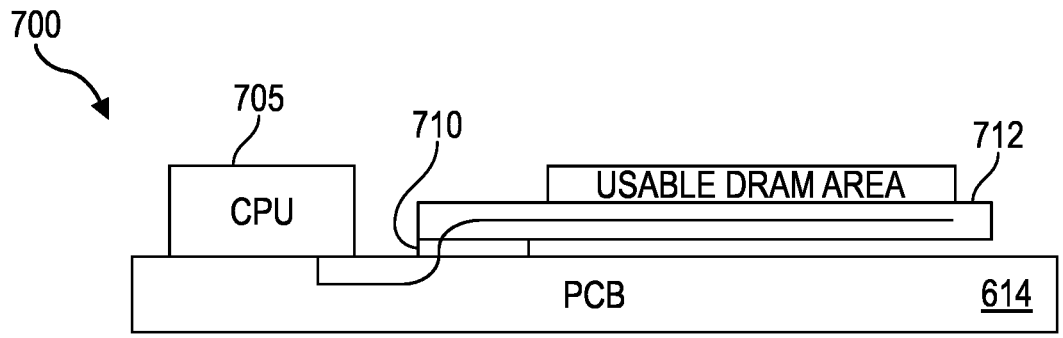
Figure 11B:
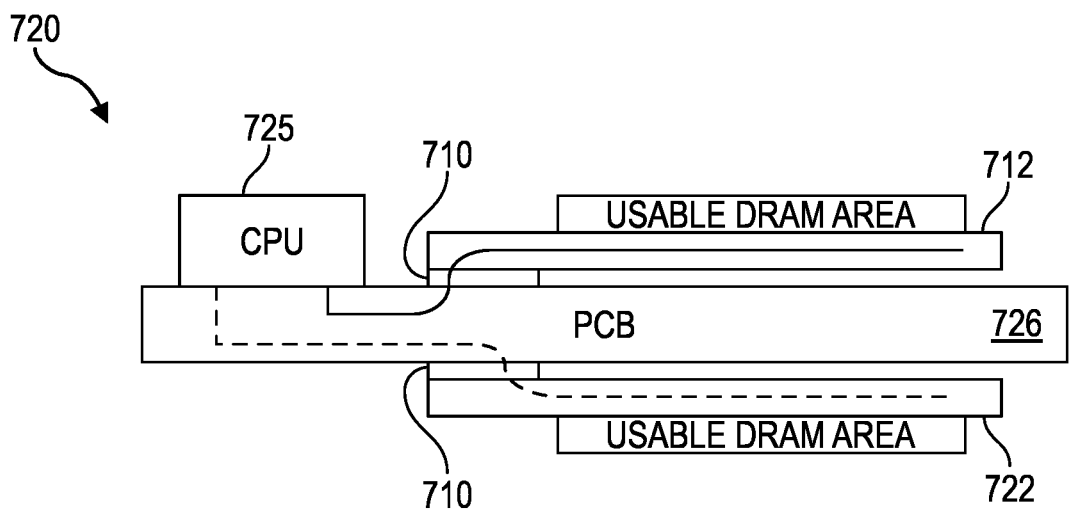
Figure 11C:
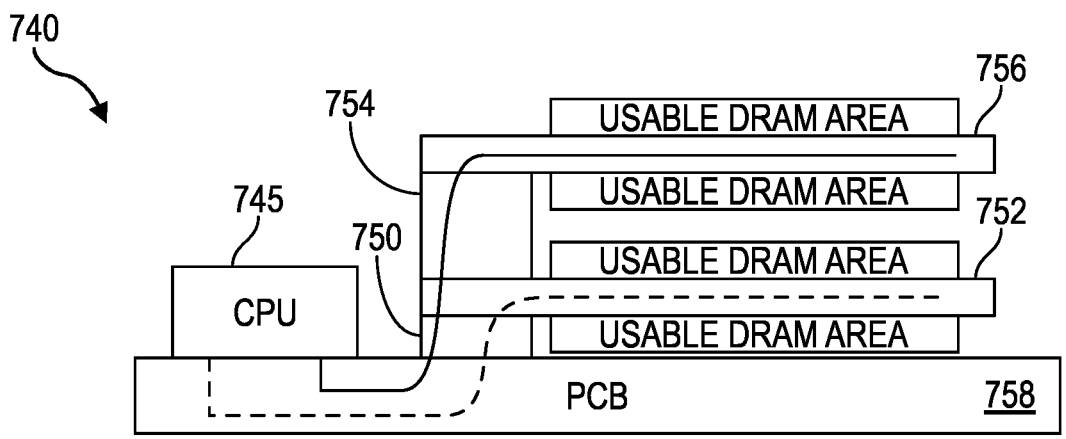

FIGS. 11A-C illustrate the use of cDIMMs that are arranged to only utilize one memory channel, while remaining compatible with cDIMM connectors that provide contact elements for two memory channels. In FIG. 11A, IHS 700 includes processor 705, cDIMM connector 710 mounted on PCB 714, and into which cDIMM 712 is populated. IHS 700 is similar to IHSs 200 and 250, in that both memory channels are routed through cDIMM connector 410. However, cDIMM 712 is arranged such that only the contact connections associated with a single memory channel, here illustrated as the first memory channel, are used.

The array of contact connections on cDIMM 712 may include contact connections for both memory channels. However, the DRAMs on cDIMM 712 are only accessed via a single memory channel. cDIMM 712 may be arranged with contact connections only on a bottom side of memory circuit board of the cDIMM, or on both a bottom side and on a top side of the memory circuit board, as needed or desired. The embodiment represented by IHS 700 may be utilized for highly compact, low-cost systems.

In FIG. 11B, IHS 720 includes processor 725, a pair of cDIMM connectors 710, one mounted on a top side of PCB 726, and the other mounted on a bottom side of PCB 726, and into which a pair of cDIMMs 712 and 722 are mounted. cDIMM 712 is mounted on the top side of PCB 726 and cDIMM 722 is mounted on the bottom side of PCB 726. Here, both cDIMM 712 and cDIMM 722 are arranged such that only the contact connections associated with a single memory channel are used. However, cDIMM 712 is arranged differently from cDIMM 722 in that, whereas the DRAMs on cDIMM 712 are only accessed via the first memory channel, the DRAMs on cDIMM 722 are only accessed via the second memory channel. While the configuration illustrated by IHS 720 may necessitate the provision of cDIMMs of differing types (i.e., "Channel A" cDIMMs and "Channel B" cDIMMs), the compactness and simplicity of design of the associated IHS may be advantageous in certain designs.

In FIG. 11C, IHS 740 includes processor 745, a pair of cDIMM connectors 750 and 754, and a pair of cDIMMs 752 and 756. IHS 740 is mechanically similar to IHS 600, with cDIMM connector 750 mounted to PCB 758, into which cDIMM 752 is installed. CDIMM connector 754 is then mounted to the top side of cDIMM 752, into which cDIMM 756 is mounted. In terms of connections to the DRAMs of cDIMMs 752 and 756, cDIMM 754 is similar to cDIMM 712, where the DRAMs on cDIMM 752 are only accessed via the first memory channel, and cDIMM 752 is similar to cDIMM 722, where the DRAMs on cDIMM 732 are only accessed via the second memory channel.

In addition to the foregoing, various embodiments of the systems and methods described herein deal specifically with Low-Power DDR (LPDDR) memory implementations.

LPDDR is a type of synchronous dynamic random-access memory that consumes less power than ordinary DDR, and that is commonly used in small form factor IHSs.

Today, there are two main system memory options for small form factor IHSs: (i) 1 to 4 SODIMMs, or (ii) a Low-Power DDR (LPDDR) DRAM module soldered down to the motherboard. Each of these options has its own shortcomings. Particularly, SODIMMs are large and restrict our ability to further reduce the size of a small form factor IHS. Meanwhile, a conventionally soldered down LPDDR memory module presents business risks (for memory field excursions) and adds motherboard complexity in terms of quantity of assembly configurations.

Using systems and methods described herein, however, LPDDR devices may be deployed in an IHS in a modular fashion. Using these systems and methods, an LPDDR memory may be provided as a Compression Attached Memory Module (CAMM) and stacked directly above a cDIMM connector to minimize impact to motherboard footprint. Instead of being soldered down, mechanical compression may be used to attach an LPDDR memory module to the cDIMM connector (and to a motherboard). These systems and methods may provide, on a common PCB, varying LPDDR DRAM capacities with silicon stacks of 1-8, such that 8, 16, 32, or 64 GB may be supported.

Figure 12A:
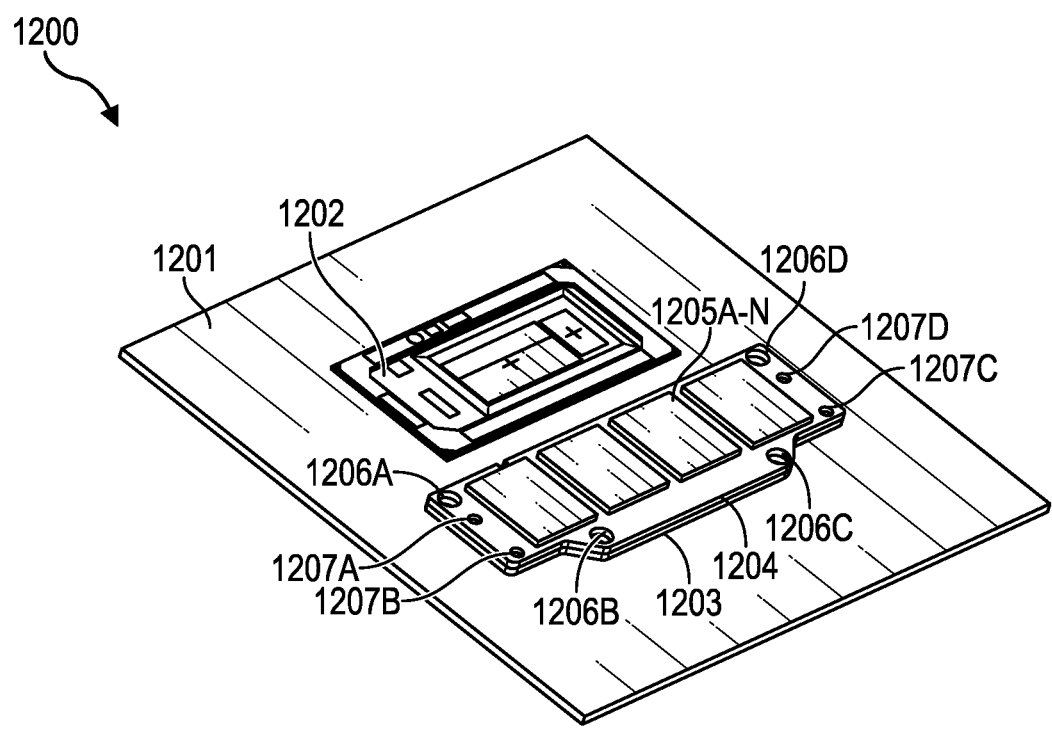
Figure 12B:
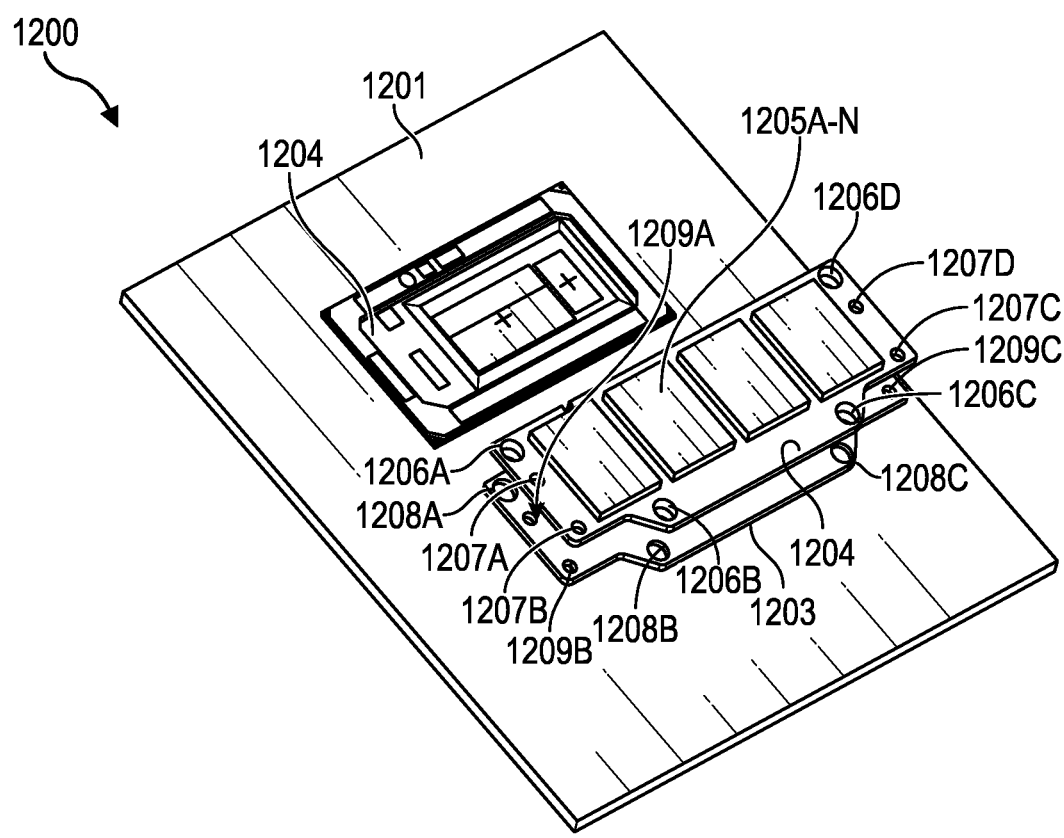

FIGS. 12A (perspective view) and 12B (exploded view) show LPDDR memory module 1204 deployed in an IHS in a modular fashion. Particularly, the IHS includes motherboard 1201 having processor socket 1202 configured to receive an IHS component (e.g., a processor, controller, CPU, GPU, etc.) and cDIMM connector 1203 configured to receive LPDDR memory module 1204 accessible to the IHS component (e.g., via traces in motherboard 1201).

In various embodiments, motherboard 1201 may include a multilayer board that are constructed with densely routed layers and held together through a lamination process, such that its layers are electrically interconnected using vias. Routing to via field(s) may maintain Type-3 PCB and reduce or minimize crosstalk while providing a clean, direct routing to minimize trace lengths. Moreover, LPDDR memory module 1204 may include any suitable number of LPDDR memory devices 1205A-N (e.g., 4) mounted thereon.

LPDDR memory module 1204 includes a set of mounting openings, holes, or perforations 1206A-D that match another set of mounting openings, holes, or perforations 1208A-D of cDIMM connector 1203. To assemble LPDDR memory module 1204 onto motherboard 1201, a user or manufacturer may introduce fasteners (e.g., compression screws) through the mounting openings, holes, or perforations 1206A-D and 1208A-D to secure LPDDR memory module 1204 to its intended location with respect to cDIMM connector 1203 and/or motherboard 1201, and to apply a compressive force to the assembly. In other cases, cDIMM connector 1203 may be coupled to (e.g., directly soldered to) motherboard, and LPDDR memory module 1204 may be directly coupled to cDIMM connector 1203 only.

LPDDR memory module 1204 further includes a set of alignment markings or physical features 1207A-D that match another set of a set of alignment markings or physical features 1209A-D of cDIMM connector 1203. During its assembly or servicing, a user, technician, or manufacturer may move LPDDR memory module 1204 over and around cDIMM connector 1203 until markings or physical features 1207A-D match markings or physical features 1209A-D to facilitate their alignment.

In various embodiments, LPDDR memory module 1204 may have a same vertical footprint (z-axis) as cDIMM connector 1203. Alternatively, LPDDR memory module 1204 may have a smaller vertical footprint than cDIMM connector 1203.

Once an IHS component is coupled to socket 1202 of motherboard 1201, the IHS component accesses LPDDR memory module 1204 via a set of surface contact elements on the top surface of cDIMM connector 1203 electrically coupled to a corresponding set of surface contact connections on a bottom surface of LPDDR memory module 1204.

Similarly as described with respect to FIGS. 3A-C, here a first set of surface contact connections on the bottom surface of LPDDR memory module 1204 may be associated with a first memory channel and arranged as a mirror image of a second set of surface contact connections associated with a second memory channel with respect to a middle row or column of the surface contact connections. Additionally, or alternatively, a first set of surface contact connections associated with a first memory channel and a second set of surface contact connections associated with a second memory channel arranged as a mirror image of a third set of surface contact connections associated with a third memory channel and a fourth set of surface contact connections associated with a fourth memory channel with respect to a middle row or column of the surface contact connections. With surface contacts on the bottom surface and with LPDDR components on the top surface, an HDI PCB design may be implemented to avoid interference between top and bottom pads and any connecting vias.

Figure 13:
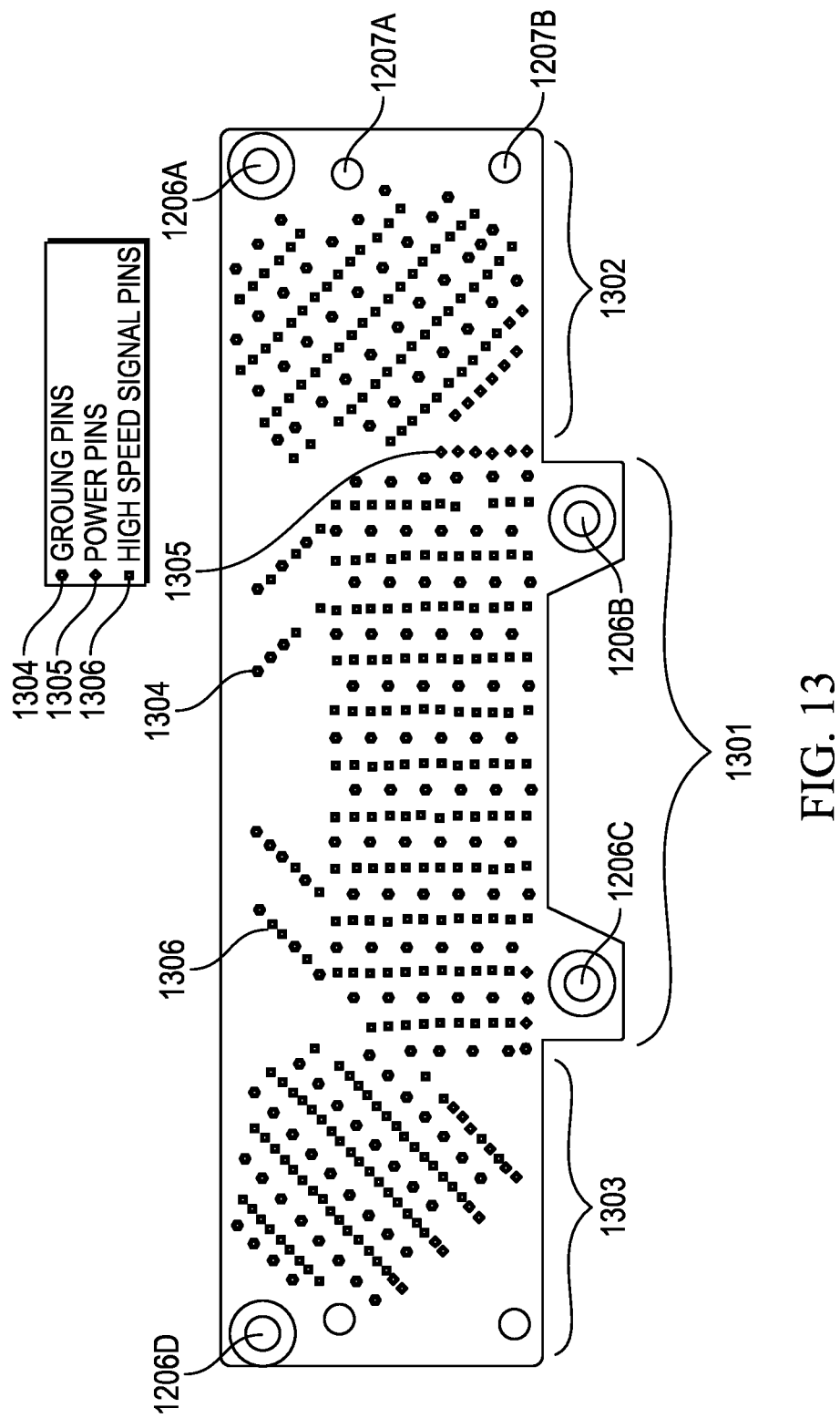
FIG. 13 illustrates a diagram of examples of surface contact connections on the bottom surface of an LPDDR memory module, according to embodiments of the present disclosure.

FIG. 13 shows a diagram (bottom view) illustrating examples of surface contact connections on the bottom surface of LPDDR memory module 1204. In this example, the plurality of surface contact connections may include middle set of connections 1301, left set of connections 1302, and right set of connections 1303, disposed as shown. Specifically, right set of connections 1303 may have its pin columns disposed at an acute angle (e.g., 45°) with respect to columns of middle set of connections 3101 and left set of connections 1302 may have its pin columns disposed at a negative acute angle (e.g., −45° or 315°), with respect to columns of middle set of connections 1301. This pin arrangement optimizes electrical trace routings which simplifies trace length-matching requirements.

In this implementation, the plurality of surface contact connections may include a total of: 144 ground pins 1304, 31 power pins 1305, and 254 high-speed pins 1306 (429 pins total). Particularly, middle set of connections 1301 may include: 72 ground pins 1304, 10 power pins 1305, and 127 high-speed pins 1306. Left set of connections 1302 may include: 36 ground pins 1304, 12 power pins 1305, and 61 high-speed pins 1306. And right set of connections 1303 may include: 36 ground pins 1304, 9 power pins 1305, and 66 high-speed pins 1306. In alternative implementations, however other pinout configurations may be implemented.

As such, systems and methods described herein may enable the use of LPDDR memory modules as a SODIMM replacement. An LPDDR memory module as described herein brings modularity and uses substantially less space than two SODIMMs. Moreover, these systems and methods may also reduce the total power consumption of small form factor IHSs.

Figure 14:
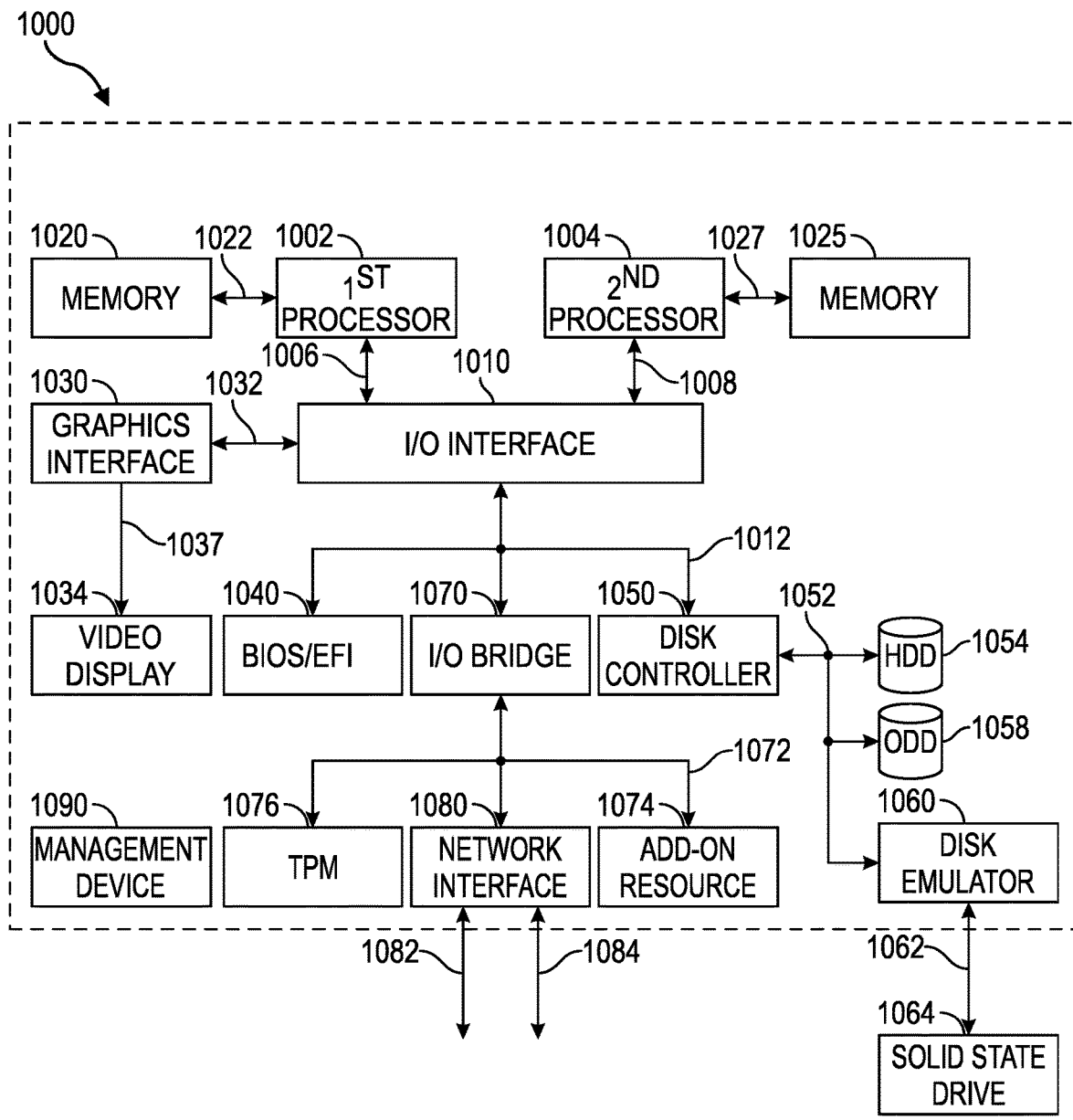
FIG. 14 illustrates a diagram of additional components of an IHS according to another embodiment of the present disclosure.

FIG. 14 illustrates a generalized embodiment of an IHS 1000 similar to IHS 100. For purpose of this disclosure an IHS can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 1000 can be a personal computer, a laptop computer, a smart phone, a tablet device or other consumer electronic device, a network server, a network storage device, a switch router or other network communication device, or any other suitable device and may vary in size, shape, performance, functionality, and price. Further, IHS 1000 can include processing resources for executing machine-executable code, such as a central processing unit (CPU), a programmable logic array (PLA), an embedded device such as a System-on-a-Chip (SoC), or other control logic hardware. IHS 1000 can also include one or more computer-readable medium for storing machine-executable code, such as software or data. Additional components of IHS 1000 can include one or more storage devices that can store machine-executable code, one or more communications ports for communicating with external devices, and various input and output (I/O) devices, such as a keyboard, a mouse, and a video display. IHS 1000 can also include one or more buses operable to transmit information between the various hardware components.

IHS 1000 can include devices or modules that embody one or more of the devices or modules described below, and operates to perform one or more of the methods described below. IHS 1000 includes a processors 1002 and 1004, an input/output (I/O) interface 1010, memories 1020 and 1025, a graphics interface 1030, a basic input and output system/universal extensible firmware interface (BIOS/UEFI) module 1040, a disk controller 1050, a hard disk drive (HDD) 1054, an optical disk drive (ODD) 1056, a disk emulator 1060 connected to an external solid state drive (SSD) 1062, an I/O bridge 1070, one or more add-on resources 1074, a trusted platform module (TPM) 1076, a network interface 1080, a management device 1090, and a power supply 1095. Processors 1002 and 1004, I/O interface 1010, memory 1020, graphics interface 1030, BIOS/UEFI module 1040, disk controller 1050, HDD 1054, ODD 1056, disk emulator 1060, SSD 1062, I/O bridge 1070, add-on resources 1074, TPM 1076, and network interface 1080 operate together to provide a host environment of IHS 1000 that operates to provide the data processing functionality of the IHS. The host environment operates to execute machine-executable code, including platform BIOS/UEFI code, device firmware, operating system code, applications, programs, and the like, to perform the data processing tasks associated with IHS 1000.

In the host environment, processor 1002 is connected to I/O interface 1010 via processor interface 1006, and processor 1004 is connected to the I/O interface via processor interface 1008. Memory 1020 is connected to processor 1002 via a memory interface 1022. Memory 1025 is connected to processor 1004 via memory interface 1027, which may include cDIMM connector configured to receive an LPDDR memory module, or the like. Graphics interface 1030 is connected to I/O interface 1010 via a graphics interface 1032, and provides a video display output 1036 to a video display 1034. In a particular embodiment, IHS 1000 includes separate memories that are dedicated to each of processors 1002 and 1004 via separate memory interfaces. An example of memories 1020 and 1030 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1040, disk controller 1050, and I/O bridge 1070 are connected to I/O interface 1010 via an I/O channel 1012. An example of I/O channel 1012 includes a Peripheral Component Interconnect (PCI) interface, a PCI-Extended (PCI-X) interface, a high-speed PCIExpress (PCIe) interface, another industry standard or proprietary communication interface, or a combination thereof. I/O interface 1010 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 1040 includes BIOS/UEFI code operable to detect resources within IHS 1000, to provide drivers for the resources, initialize the resources, and access the resources. BIOS/UEFI module 1040 includes code that operates to detect resources within IHS 1000, to provide drivers for the resources, to initialize the resources, and to access the resources.

Disk controller 1050 includes a disk interface 1052 that connects the disk controller to HDD 1054, to ODD 1056, and to disk emulator 1060. An example of disk interface 1052 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1060 permits SSD 1064 to be connected to IHS 1000 via an external interface 1062. An example of external interface 1062 includes a USB interface, an IEEE 1394 (Firewire) interface, a proprietary interface, or a combination thereof. Alternatively, solid-state drive 1064 can be disposed within IHS 1000.

I/O bridge 1070 includes a peripheral interface 1072 that connects the I/O bridge to addon resource 1074, to TPM 1076, and to network interface 1080. Peripheral interface 1072 can be the same type of interface as I/O channel 1012, or can be a different type of interface. As such, I/O bridge 1070 extends the capacity of I/O channel 1012 when peripheral interface 1072 and the I/O channel are of the same type, and the I/O bridge translates information from a format suitable to the I/O channel to a format suitable to the peripheral channel 1072 when they are of a different type. Add-on resource 1074 can include a data storage system, an additional graphics interface, a network interface card (NIC), a sound/video processing card, another add-on resource, or a combination thereof. Add-on resource 1074 can be on a main circuit board, on separate circuit board or add-in card disposed within IHS 1000, a device that is external to the IHS, or a combination thereof.

Network interface 1080 represents a NIC disposed within IHS 1000, on a main circuit board of the IHS, integrated onto another component such as I/O interface 1010, in another suitable location, or a combination thereof. Network interface device 1080 includes network channels 1082 and 1084 that provide interfaces to devices that are external to IHS 1000. In a particular embodiment, network channels 1082 and 1084 are of a different type than peripheral channel 1072 and network interface 1080 translates information from a format suitable to the peripheral channel to a format suitable to external devices. An example of network channels 1082 and 1084 includes InfiniBand channels, Fibre Channel channels, Gigabit Ethernet channels, proprietary channel architectures, or a combination thereof. Network channels 1082 and 1084 can be connected to external network resources (not illustrated). The network resource can include another IHS, a data storage system, another network, a grid management system, another suitable resource, or a combination thereof.

Management device 1090 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for IHS 1000. In particular, management device 1090 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of IHS 1000, such as system cooling fans and power supplies.

Management device 1090 can include a network connection to an external management system, and the management device can communicate with the management system to report status information for IHS 1000, to receive BIOS/UEFI or system firmware updates, or to perform other task for managing and controlling the operation of IHS 1000. Management device 1090 can operate off of a separate power plane from the components of the host environment so that the management device receives power to manage IHS 1000 when the IHS is otherwise shut down.

An example of management device 1090 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated DELL REMOTE ACCESS CONTROLLER (iDRAC), an Embedded Controller (EC), or the like. Management device 1090 may further include associated memory devices, logic devices, security devices, or the like, as needed or desired.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, IoT devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a compression Dual In-Line Memory Module (cDIMM) connector coupled to a motherboard; and
a memory module coupled to the cDIMM connector, wherein the memory module comprises a Low-Power Double Data Rate (LPDDR) device coupled to a top surface of the memory module and accessible via surface contact connections disposed on a bottom surface of the memory module;
wherein the surface contact connections include a left set of connections, a middle set of connections, and a right set of connections, wherein the right set of connections has columns disposed at an acute angle with respect to columns of the middle set of connections, and wherein the left set of connections has columns disposed at a negative acute angle with respect to the columns of the middle set of connections.

2. The IHS of claim 1, wherein the memory module has a same vertical footprint as the cDIMM connector or a smaller vertical footprint than the cDIMM connector.

3. The IHS of claim 1, wherein the memory module and the cDIMM connector comprise a plurality of holes configured to receive fasteners that apply a compressive force between the memory module and the cDIMM connector.

4. The IHS of claim 1, wherein the memory module and the cDIMM connector comprise a plurality of alignment features configured to facilitate mounting of the memory module to the cDIMM connector.

5. The IHS of claim 1, further comprising a processor coupled to the motherboard, wherein the processor is configured to access the LPDDR device via the surface contact connection.

6. The IHS of claim 1, wherein each surface contact connection is configured to be engaged with a corresponding surface contact element of the cDIMM connector.

7. The IHS of claim 1, wherein the left set of surface contact connections is associated with a first memory channel and arranged as a mirror image of the right set of surface contact connections associated with a second memory channel with respect to a middle row or column of the surface contact connections.

8. The IHS of claim 1, wherein the memory module comprises a plurality of LPDDR devices, and wherein the LPDDR devices are configured to be accessed via four memory channels.

9. The IHS of claim 8, wherein a first set of surface contact connections associated with a first memory channel and a second set of surface contact connections associated with a second memory channel are arranged as a mirror image of a third set of surface contact connections associated with a third memory channel and a fourth set of surface contact connections associated with a fourth memory channel with respect to a middle row or column of the surface contact connections.

10. A memory module, comprising:
  a plurality of Low-Power Double Data Rate (LPDDR) devices coupled to a top surface of the memory module; and
  a plurality of surface contact connections disposed on a bottom surface of the memory module, wherein each surface contact connection is configured to be engaged with a corresponding surface contact element of a compression Dual In-Line Memory Module (cDIMM) connector after assembly;
  wherein the surface contact connections include a left set of connections, a middle set of connections, and a right set of connections, wherein the right set of connections has columns disposed at an acute angle with respect to columns of the middle set of connections, and wherein the left set of connections has columns disposed at a negative acute angle with respect to the columns of the middle set of connections.

11. The memory module of claim 10, wherein the memory module has a same vertical footprint as the cDIMM connector or a smaller vertical footprint than the cDIMM connector.

12. The memory module of claim 10, further comprising a plurality of holes configured to receive fasteners that apply a compressive force between the memory module and the cDIMM connector.

13. The memory module of claim 10, further comprising a plurality of alignment features configured to facilitate mounting of the memory module to the cDIMM connector.

14. The memory module of claim 10, wherein the left set of surface contact connections is associated with a first memory channel and arranged as a mirror image of the right set of surface contact connections associated with a second memory channel with respect to a middle row or column of the surface contact connections.

15. The memory module of claim 10, wherein the plurality of LPDDR devices is configured to be accessed via four memory channels.

16. The memory module of claim 15, wherein a first set of surface contact connections associated with a first memory channel and a second set of surface contact connections associated with a second memory channel are arranged as a mirror image of a third set of surface contact connections associated with a third memory channel and a fourth set of surface contact connections associated with a fourth memory channel with respect to a middle row or column of the surface contact connections.

17. A method, comprising:
  receiving a memory module having Low-Power Double Data Rate (LPDDR) devices coupled to a top surface of the memory module and configured to be accessed via surface contact connections disposed on a bottom surface of the memory module; and
  coupling the memory module to a compression Dual In-Line Memory Module (cDIMM) connector of a Printed Circuit Board (PCB) of an Information Handling System (IHS), wherein each of the surface contact connections is configured to be engaged with a corresponding surface contact element of the cDIMM connector;
  wherein the surface contact connections include a left set of connections, a middle set of connections, and a right set of connections, wherein the right set of connections has columns disposed at an acute angle with respect to columns of the middle set of connections, and wherein the left set of connections has columns disposed at a negative acute angle with respect to the columns of the middle set of connections.

18. The method of claim 17, further comprising decoupling the memory module from the cDIMM connector.

* * * * *